United States Patent
Oyu et al.

(10) Patent No.: US 8,704,299 B2
(45) Date of Patent: Apr. 22, 2014

(54) SEMICONDUCTOR DEVICE AND MANUFACTURING METHOD THEREOF

(71) Applicant: Elpida Memory, Inc., Tokyo (JP)

(72) Inventors: Kiyonori Oyu, Tokyo (JP); Kensuke Okonogi, Tokyo (JP); Kazuto Mori, Tokyo (JP)

( * ) Notice: Subject to any disclaimer, the term of this patent is extended or adjusted under 35 U.S.C. 154(b) by 0 days.

(21) Appl. No.: 13/736,381

(22) Filed: Jan. 8, 2013

(65) Prior Publication Data

US 2013/0181271 A1 Jul. 18, 2013

(30) Foreign Application Priority Data

Jan. 17, 2012 (JP) .................................. 2012-007445

(51) Int. Cl.
*H01L 27/108* (2006.01)
(52) U.S. Cl.
USPC .................................. 257/334; 257/E27.091
(58) Field of Classification Search
USPC .................................. 257/308, 334, E27.091
See application file for complete search history.

(56) References Cited

U.S. PATENT DOCUMENTS

| 6,501,119 | B1 * | 12/2002 | Ohno ........................... 257/306 |
| 7,465,637 | B2 | 12/2008 | Yamazaki |
| 7,622,354 | B2 * | 11/2009 | Dreeskornfeld et al. ..... 438/272 |
| 7,659,571 | B2 | 2/2010 | Yamazaki |
| 2006/0273388 | A1 | 12/2006 | Yamazaki |
| 2007/0072375 | A1 | 3/2007 | Yamazaki |

FOREIGN PATENT DOCUMENTS

| JP | 2006-339476 | 12/2006 |
| JP | 2007-081095 | 3/2007 |

* cited by examiner

*Primary Examiner* — Chandra Chaudhari
(74) *Attorney, Agent, or Firm* — Young & Thompson

(57) ABSTRACT

A semiconductor device capable of increasing ON current while reducing channel resistance and allowing transistors to operate independently and stably, having a fin formed to protrude from the bottom of a gate electrode trench, a gate insulating film covering the surfaces of the gate electrode trench and the fin, a gate electrode embedded in a lower part of the gate electrode trench and formed to stride over the fin via the gate insulating film, a first impurity diffusion region arranged on a first side face, and a second impurity diffusion region arranged on a second side face.

13 Claims, 30 Drawing Sheets

SEMICONDUCTOR DEVICE AND MANUFACTURING METHOD THEREOF

This application is based upon and claims the benefit of priority from Japanese Patent Application No. 2012-007445, filed on Jan. 17, 2012, the disclosure of which is incorporated herein in its entirety by reference.

BACKGROUND OF THE INVENTION

1. Field of the Invention

This invention relates to a semiconductor device and a manufacturing method of a semiconductor device.

2. Description of the Related Art

In recent years, miniaturization of semiconductor devices such as DRAM (Dynamic Random Access Memory) has been pursued. When the transistor gate length of a transistor is reduced, the short channel effect in the transistor becomes pronounced, and problems arise of increased subthreshold current and reduced threshold voltage (Vt) of the transistor.

Further, if the impurity concentration in a semiconductor substrate is increased in order to suppress drop of the transistor threshold voltage (Vt), joint leak current will be increased.

Therefore, when DRAM (Dynamic Random Access Memory) is used as a semiconductor device and a DRAM memory cell is miniaturized, degradation of refresh characteristics poses a serious problem.

In order to avoid such problems, Japanese Laid-Open Patent Publication No. 2006-339476 (Patent Document 1) and No. 2007-081095 (Patent Document 2) disclose a so-called trench-gate transistor (also called "recess channel transistor") in which a gate electrode is embedded in a trench formed in a principal surface of a semiconductor substrate.

The use of a trench-gate transistor makes it possible to ensure a physically sufficient effective channel length (gate length), and to realize a DRAM having minute cells with a minimum processing size of 60 nm or less.

Patent Document 2 discloses a DRAM having two trenches formed in a semiconductor substrate to be adjacent to each other, a gate electrode formed in each of the trenches via a gate insulating film, a first impurity diffusion region formed on a principal surface of the semiconductor substrate between the two gate electrodes and serving as a common impurity diffusion region for the two gate electrodes, and a second impurity diffusion region formed on the principal surface of the semiconductor substrate located on an element isolation region side of each of the two gate electrodes.

SUMMARY

In the DRAM having a trench-gate transistor as disclosed in Patent Documents 1 and 2, the channel region of the transistor is formed on three surfaces consisting of the opposite side faces and the bottom face of the trench.

The inventor has found that if the size of a transistor configured as described above is further reduced, sufficient ON current cannot be obtained for the transistor, and hence the DRAM becomes difficult to operate normally. This is attributable to the fact that the channel resistance is increased due to the transistor channel region being formed on the three surfaces forming the trench.

Further, another problem has been revealed that if the trench gate arrangement pitch is reduced, operation of one transistor will interfere with operation of another transistor adjacent thereto, and thus independent operation of the transistors becomes impossible.

It is believed that this problem is also attributable to the fact that a channel region is formed between the trench gates.

Further, in a trench-gate transistor, a gate electrode is formed to project above the surface of a semiconductor substrate. The projected gate electrode itself makes it extremely difficult to form bit wiring and a capacitor in later steps. This poses a problem that manufacturing of a DRAM itself becomes difficult.

Thus, there is a demand for a semiconductor device that is capable of ensuring sufficient transistor ON current while avoiding operational interference between adjacent transistors, and thus resolving the problem of difficulty in manufacturing, even if the semiconductor device is a DRAM having transistors with trenches. There is also a demand for a manufacturing method of such a semiconductor device.

An aspect of the invention provides a semiconductor device including: a plurality of first element isolation regions provided in a semiconductor substrate to extend in a first direction and each defining an active region having a plurality of element formation regions; a gate electrode trench provided in a surface layer of the semiconductor substrate to extend in a second direction intersecting with the first element isolation regions and the active regions, and having first and second side faces facing each other and a bottom; a fin formed such that a part of the active region protrudes from the bottom of the gate electrode trench by forming the gate electrode trench such that a first trench section thereof formed in the active region has a smaller depth than a second trench section thereof formed in the first element isolation region, and the depth of the part of the first trench facing the second trench section is substantially the same as that of the second trench section; a gate insulating film covering the surfaces of the gate electrode trench and the fin; a gate electrode formed to stride over the fin via the gate insulating film by being embedded in a lower part of the gate electrode trench; a first impurity diffusion region formed in the semiconductor substrate so as to cover the top of the gate insulating film arranged on the first side face; and a second impurity diffusion region formed in the semiconductor substrate to cover the gate insulating film formed on the second side face except a lower end thereof, wherein the gate insulating film has a relationship represented by $t1 < t2$ between its thickness $t1$ on the first and second side faces of the gate electrode trench and its thickness $t2$ at a top part of the fin, and/or a relationship represented by $t2 \geq t4 < t3$ among the thickness $t2$, its thickness $t3$ in a vertical direction to the normal line on the interface between the fin and the gate insulating film at a position shifted from the top part of the fin to the bottom side of the gate electrode trench by a distance corresponding to 90% of the height of the fin, and its film thickness $t4$ between $t2$ and $t3$.

In the semiconductor device of the invention, the semiconductor substrate is provided with a first impurity diffusion region covering the top part of the gate insulating film disposed on the first side face, a second impurity diffusion region at least covering the gate insulating film disposed on the second side face, and a fin formed such that a part of the active region protrudes from the bottom of the gate electrode trench. In this configuration, channel regions are formed on the two surfaces of the bottom of the gate electrode trench and the lower part of the first side face, and on the fin, whereby it is made possible to reduce the channel resistance in comparison with a related semiconductor device in which channel regions are formed on the three surfaces of the bottom and the opposing side faces of the gate electrode trench. This makes it possible to ensure sufficient ON current of transistors.

Further, in the semiconductor device of the invention, another transistor is arranged adjacently on the second side face of the gate electrode trench, so that no channel region is formed between the gate electrode trenches. Thus, even if the gate electrode trenches are arranged at reduced pitches, operating state of one transistor which is operated will not interfere with another transistor adjacent thereto, and thus the transistors are allowed to operate independently.

Further, the gate electrode is formed to fill the lower part of the gate electrode trench and to stride over the fin via the gate insulating film, and the embedded insulating film is formed to fill the gate electrode trench and cover the top face of the gate electrode, whereby the gate electrode will not protrude above the surface of the semiconductor substrate. This facilitates the formation of a bit line and a capacitor in a later step when the semiconductor device is DRAM, and thus the semiconductor device can be easily manufactured.

BRIEF DESCRIPTION OF THE DRAWINGS

In the description below, figure numbers in FIGS. 3 to 13 with suffix "A" each represent a front view. The figure numbers in FIGS. 3 to 13 with suffix "B" are cross-sectional views taken along the line A-A in FIG. 1, those with suffix "C" are cross-sectional views taken along the line B-B in FIG. 1, and those with suffix "D" are cross-sectional views taken along the line C-C in FIG. 1. Of the drawings showing successive steps, any redundant drawings relating to the same structure will be omitted.

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The inventor obtained a new finding that as a DRAM (Dynamic Random Access Memory) memory cell is miniaturized, a distance between two adjacent cells provided in an active region is reduced, which will cause a disturb failure between the two adjacent cells (hereafter, referred to simply as the disturb failure) in which when one of the cells stores data "0" while the other stores data "1" and the cell storing data "0" is accessed successively, the data stored in the cell storing data "1" will be corrupted. This disturb failure will incur a risk of impairing the reliability of the semiconductor device.

Figure 15:
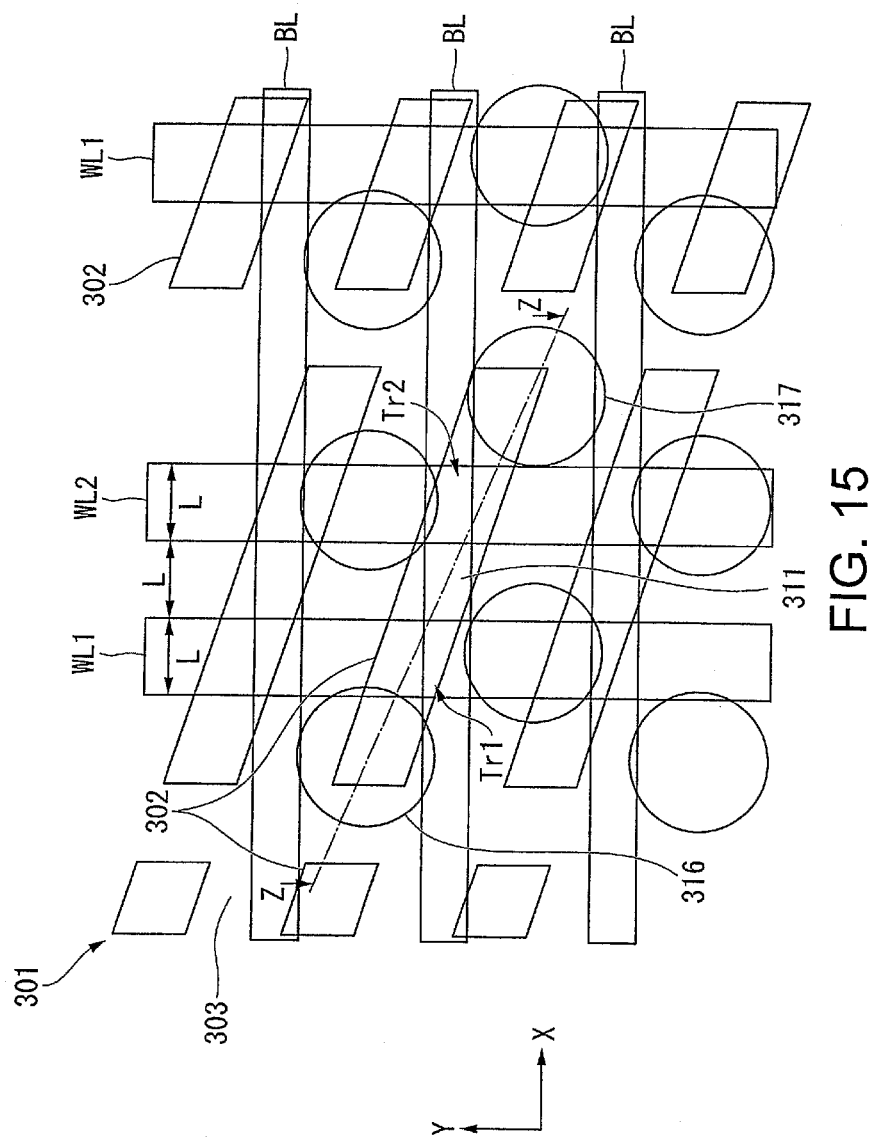
FIG. 15 is a plan view showing an example of a DRAM layout according to related art.
Figure 16:
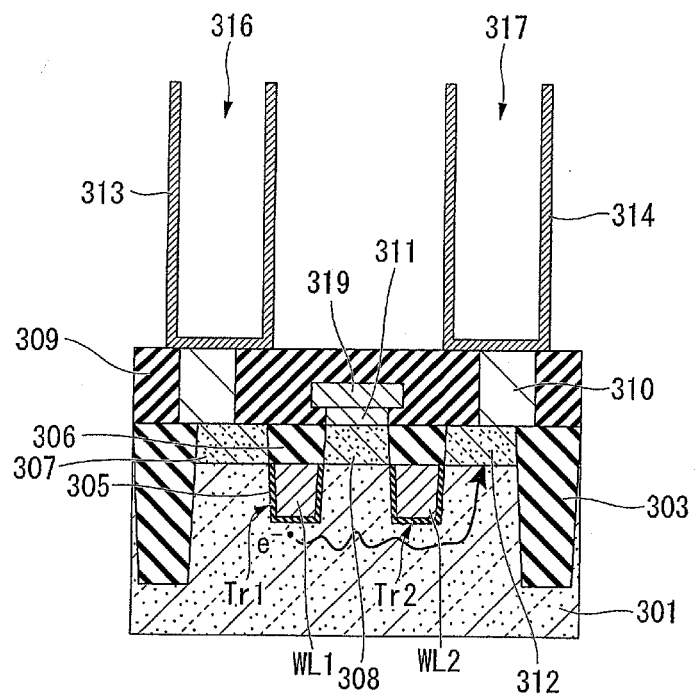
FIG. 16 is a cross-sectional view of the DRAM shown in FIG. 15 taken along the line Z-Z thereof.

FIG. 15 is a plan view showing an example of a DRAM layout according to a related art, and FIG. 16 is a cross-sectional view of the DRAM shown in FIG. 15, taken along the line Z-Z.

Findings that the inventor has obtained about the disturb failure will be described with reference to FIGS. 15 and 16.

Referring to FIG. 15, a plurality of active regions 302 are provided on a surface of a semiconductor substrate 301 while being arranged in a regular manner. Each of the active regions 302 is surrounded by element isolation regions 303 formed by filling a trench formed on the surface of the semiconductor substrate 301 with an insulating film. A plurality of word lines WL are arranged to extend in a Y direction intersecting the active regions 302.

Referring to FIG. 16, the word lines WL1, WL2 are formed by being embedded in trenches via a gate insulating film 305. The trenches are formed in the surface of the semiconductor substrate 301 to extend across the active regions 302 and element isolation regions 303.

A cap insulating film 306 is formed on top of each of the word lines WL1, WL2 by being embedded in the trench. Each of the active regions 302 is provided with two word lines consisting of the word line WL1 and the word line WL2 which intersect with the active regions 302.

The two word lines WL1 and WL2 constitute gate electrodes of their corresponding two transistors Tr1 and Tr2. The transistor Tr1 is composed of a drain diffusion layer 307 and a source diffusion layer 308 as well as the gate electrode formed by the word line WL1.

The transistor Tr2 is composed of a drain diffusion layer 312 and the source diffusion layer 308 as well as the gate electrode formed by the word line WL2. The source diffusion layer 308 is common to the transistors Tr1 and Tr2 and is connected to a bit line BL at a bit line contact 311.

The drain diffusion layers 307 and 312 are respectively connected to lower electrodes 313 and 314 (storage nodes) via capacity contact plugs 310 formed in an interlayer insulating film 309.

The lower electrodes 313 and 314 respectively form capacity elements 316 and 317 together with a capacity insulating film and upper electrodes (not shown). The surfaces of the semiconductor substrate 301 corresponding to the bottom faces and opposing side faces of the trenches in which the word lines WL1 and WL2 are embedded serves as channels of the transistors Tr1 and Tr2.

For example, when the word line WL1 is turned on to form a channel of the transistor Tr1 and a low (L) level potential is applied to the bit line 319, the lower electrode 313 becomes L level. The word line WL1 is then turn off whereby data of L level (data of "0") is stored in the lower electrode 313.

When the word line WL2 for example is turn on to form a channel of the transistor Tr2 and a high (H) level potential is applied to the bit line 319, the lower electrode 314 becomes H level. The word line WL2 is then turned off whereby data of H level (data of "1") is stored in the lower electrode 314.

Based such operating conditions, a state is established in which L-level data is stored in the lower electrode 313 and H level data is stored in the lower electrode 314. In this state, the word line WL1 corresponding to the L-side lower electrode 313 is repeatedly turned on and off (this operation corresponds to cell operation in other active regions using the same word line WL1).

As a result, electrons of e− induced in the channel of the transistor Tr1 reach the adjacent drain diffusion layer 312 and corrupt the H-level data stored in the lower electrode 314 to change it into L-level data.

This means that a failure occurs in which data of "1" is changed to data of "0". This failure depends on the number of operations to turn the word line WL1 on and off. For example, when it is assumed that one out of a plurality of cells is broken by repeating the operation to turn on and off the word line WL1 10,000 times, 10 cells will be broken when it is repeated 100,000 times.

Normally, adjacent cells must hold information independently from each other. However, if a disturb failure occurs in which the data storage state of one of the adjacent cells is changed due to operating state of the other cell, normal operation of the semiconductor device (DRAM) is impaired, leading to a problem of impaired reliability.

This disturb failure does not occur as long as the cell size is large. For example, when the distance L between the word line WL1 and the word line WL2 defined by a minimum processing size F is 70 nm as shown in FIG. 15, this disturb failure does not occur.

However, when the memory cell size is reduced until the distance between the word line WL1 and the word line WL2 becomes smaller than 50 nm, the problem of disturb failure has become more apparent. If the memory cell size is reduced furthermore, the problem will become more serious.

Exemplary preferred embodiments of the invention will be described in detail with reference to the drawings. It should be noted that the drawings used in the following description are only for explaining configurations of the embodiments, and sizes, thicknesses, and dimensions of components shown therein do not necessarily correspond to the actual dimensional relationship in a semiconductor device.

Semiconductor Device

Figure 1:
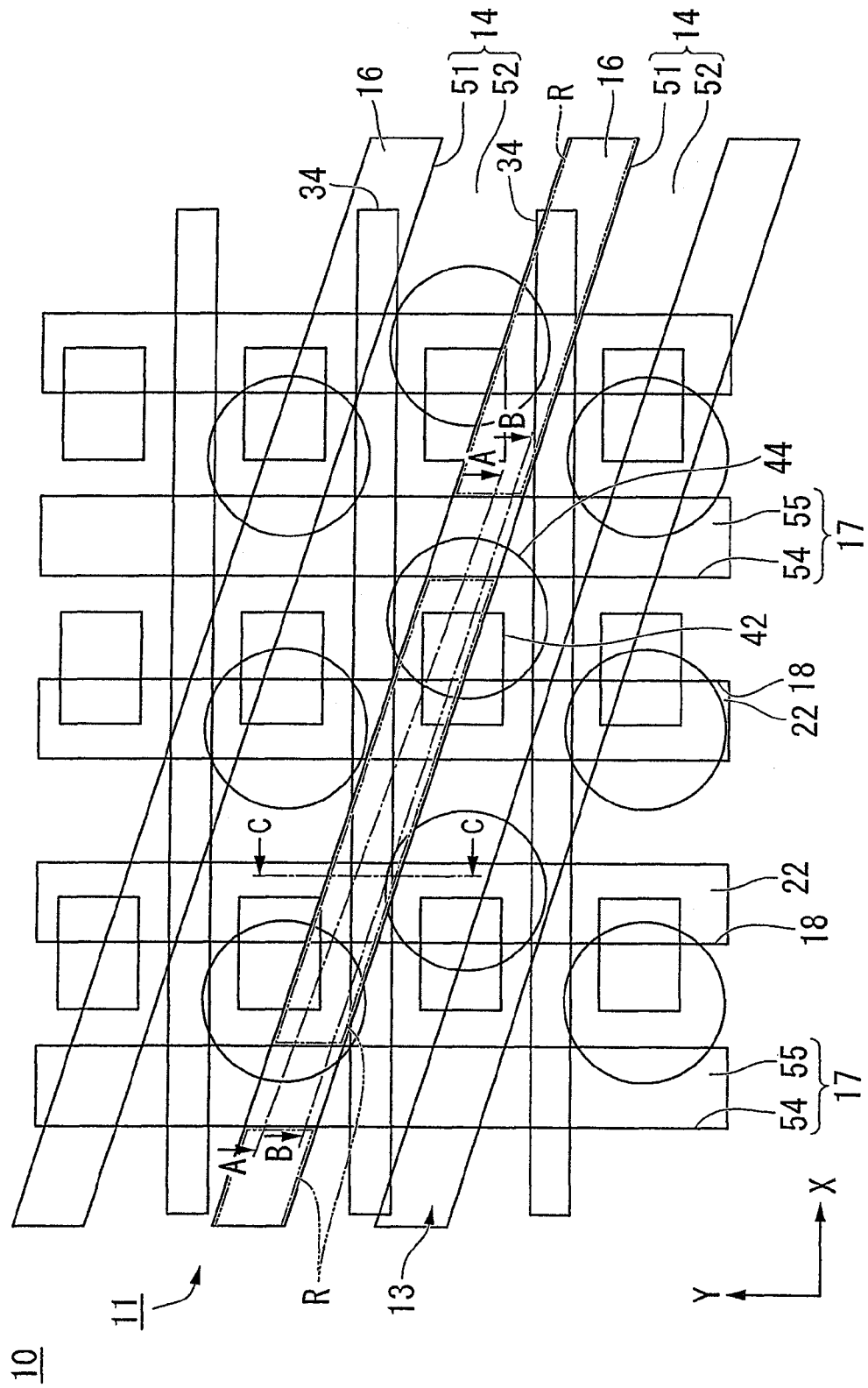
FIG. 1 is a schematic plan view showing a memory cell array provided in a semiconductor device according to an embodiment of the invention.
Figure 2A:
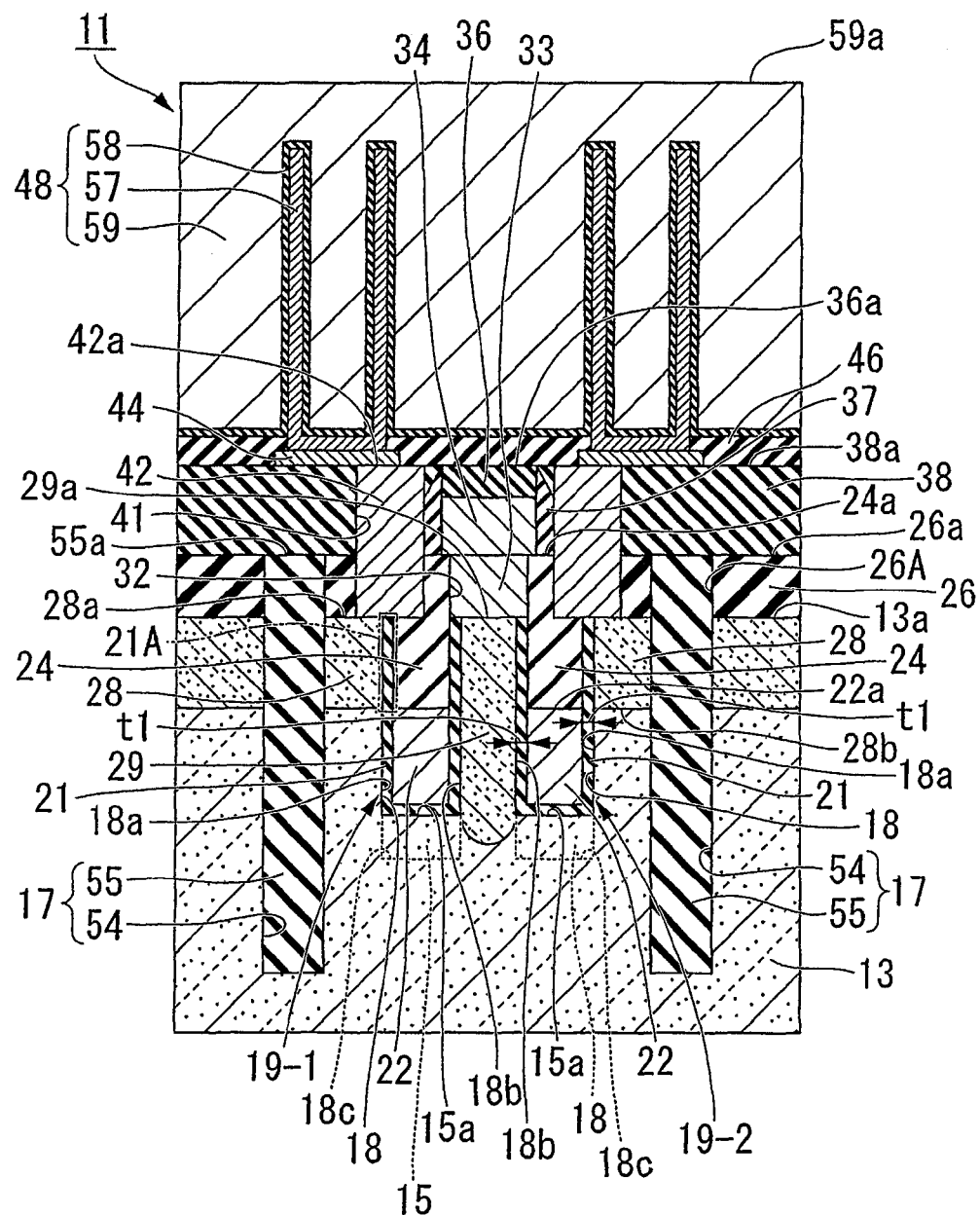
FIG. 2A is a cross-sectional view of the memory cell array taken along the line A-A in FIG. 1.
Figure 2B:
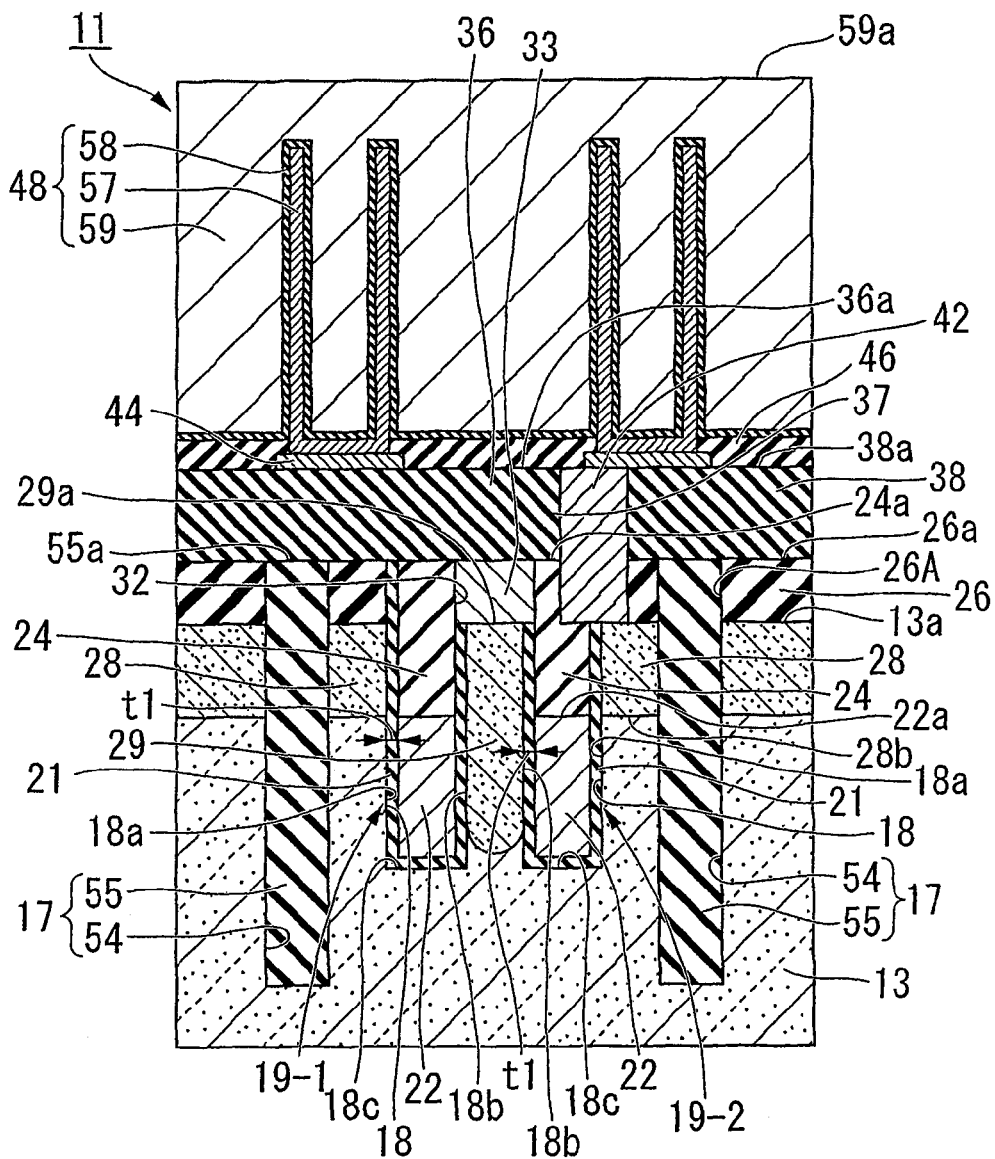
FIG. 2B is a cross-sectional view of the memory cell array taken along the line B-B in FIG. 1.
Figure 2C:
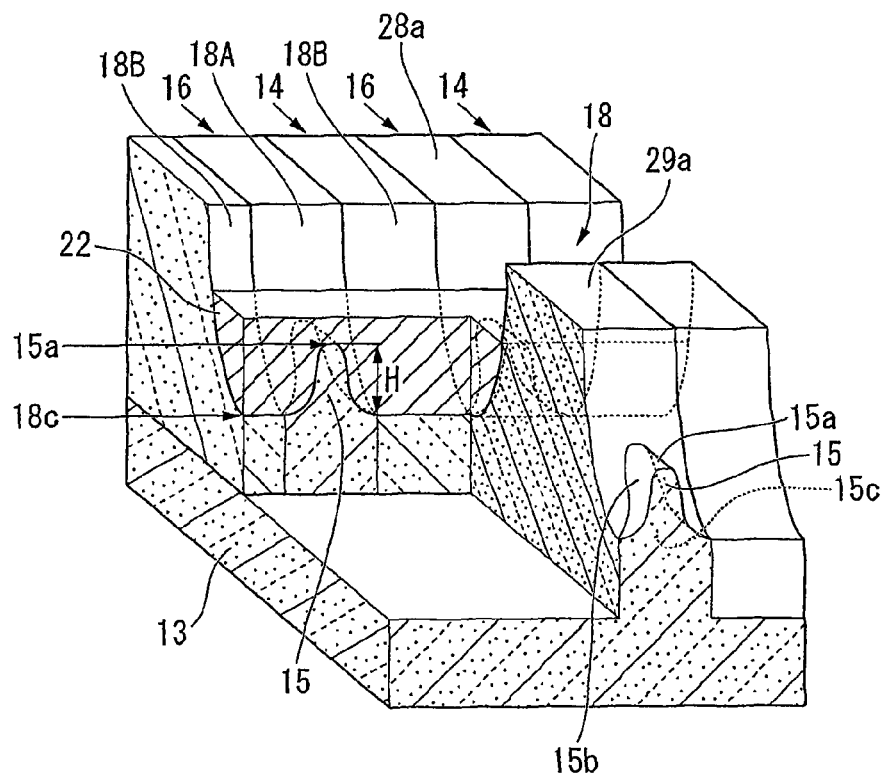
FIG. 2C is a perspective view for explaining a cross-sectional configuration of a fin provided in a gate electrode trench of the semiconductor device according to the embodiment of invention.
Figure 2D:
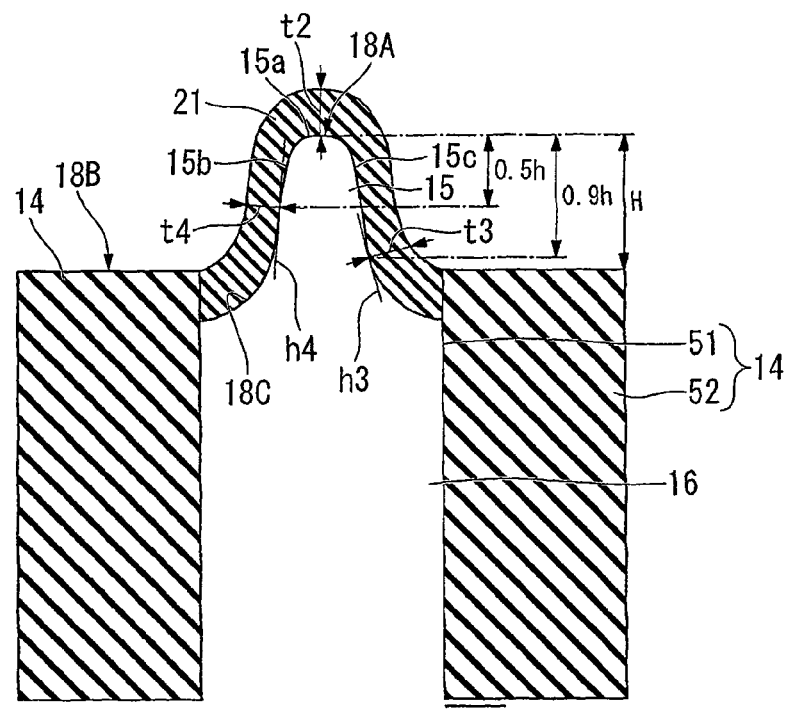
FIG. 2D is an enlarged cross-sectional view for explaining thickness of a gate insulating film provided in the semiconductor device according to the embodiment of invention.

FIG. 1 is a schematic plan view showing a memory cell array provided in a semiconductor device according to an embodiment of the invention. FIG. 2A is a cross-sectional view of the memory cell array shown in FIG. 1, taken along the line A-A thereof. FIG. 2B is a cross-sectional view of the memory cell array shown in FIG. 1, taken along the line B-B thereof. FIG. 2C is a perspective view for explaining a cross-sectional configuration of a fin provided in a gate electrode trench in the semiconductor device according to the embodiment. FIG. 2D is an enlarged cross-sectional view for explaining thickness of a gate insulating film provided in the semiconductor device according to the embodiment, and shows a cross-section taken along the line C-C in FIG. 1. For the sake of convenience of description, FIG. 2D shows only a fin 15, a gate insulating film 21, and a first element isolation region 14, while the other components of a memory cell array 11 are omitted.

In FIG. 1 and FIGS. 2A to 2D, a DRAM (Dynamic Random Access Memory) is used as an example of a semiconductor device 10 according to an embodiment of the invention. FIG. 1 illustrates an example of a layout of a DRAM memory cell array.

In FIG. 1, the X direction represents a direction in which bit lines 34 extend, while the Y direction represents a direction (second direction) in which gate electrodes 22 and second element isolation regions 17 extend, intersecting with the X direction.

For the sake of convenience of description, FIG. 1 only shows a semiconductor substrate 13, first element isolation regions 14, active regions 16, second element isolation regions 17, gate electrode trenches 18, gate electrodes 22, bit lines 34, capacity contact plugs 42, capacity contact pads 44, and a plurality of element formation regions R among the components of the memory cell array 11, while the other components of the memory cell array 11 are omitted.

FIG. 2A schematically shows bit lines 34 which actually extend in the X direction shown in FIG. 1. In FIGS. 2A to 2C, like components to those of the semiconductor device 10 shown in FIG. 1 are indicated by the same reference numerals.

The semiconductor device 10 according to the embodiment of the invention has a memory cell region in which the memory cell array 11 shown in FIG. 1 and FIGS. 2A and 2B is formed, and a not-shown peripheral circuit region (a region where a peripheral circuit is formed) arranged around the memory cell region.

As shown in FIG. 1 and FIGS. 2A and 2B, the memory cell array 11 provided in the semiconductor device 10 has a semiconductor substrate 13, a first element isolation region 14, an active region 16 having a plurality of element formation regions R, a second element isolation region 17, a gate electrode trench 18, a fins 15 formed such that a part of the active region 16 protrudes from the bottom 18c of the gate electrode trench 18, a first and second transistor 19-1, 19-2, a gate insulating film 21, a gate electrodes 22 which is an embedded gate electrode, an embedded insulating films 24, a mask insulating film 26, a first impurity diffusion region 28, a second impurity diffusion region 29, an opening 32, a bit line contact plug 33, a bit line 34, a cap insulating film 36, a sidewall film 37, an interlayer insulating film 38, a contact hole 41, a capacity contact plug 42, a capacity contact pad 44, a silicon nitride film 46, and a capacitor 48.

As shown in FIG. 1 and FIGS. 2A and 2B, the semiconductor substrate 13 is a plate-like substrate.

The semiconductor substrate 13 may be, for example, a p-type mono-crystalline silicon substrate. In this case, the concentration of the p-type impurity in the semiconductor substrate 13 can be set to 1E16 atoms/cm$^2$, for example.

As shown in FIG. 1 and FIG. 2D, the first element isolation region 14 has a first element isolation trench 51 and a first element isolation insulating film 52. The first element isolation trench 51 is formed in the semiconductor substrate 13 so as to extend in a direction (first direction) inclined at a predetermined angle to the X direction shown in FIG. 1. The first element isolation trench 51 is formed in plurality at predetermined intervals with respect to the Y direction shown in FIG. 1. The depth of the first element isolation trench 51 may be set to 250 nm, for example.

The first element isolation insulating film 52 is provided so as to fill the first element isolation trench 51. Although not shown in the drawings, the top face of the first element isolation insulating film 52 is made flush with the principal surface 13a of the semiconductor substrate 13. The first element isolation insulating film 52 may be, for example, a silicon oxide film (SiO$_2$ film).

The first element isolation region 14 configured as described above defines an active region 16 extending in a band-like fashion across the second direction.

As shown in FIG. 1 and FIGS. 2A and 2B, the second element isolation region 17 has a second element isolation trench 54 and a second element isolation insulating film 55. The second element isolation trench 54 is formed in the semiconductor substrate 13 so as to extend in the Y direction (second direction) as shown in FIG. 1. Thus, the second element isolation trench 54 cuts off a part of the first element isolation region 14. The second element isolation trenches 54 is formed in pair so as to sandwich the two gate electrodes 22 arranged adjacent to each other.

Each of the gate electrodes 22 forms a word line of the memory cell. This means that in the memory cell according to this embodiment, one second element isolation region 17 and two gate electrodes 22 (word lines) extending in the Y direction constitute one set, which is arranged repeatedly in the X direction.

The depth of the second element isolation trench 54 can be set to 250 nm, for example.

The second element isolation insulating films 55 is formed to fill the second element isolation trench 54 and an opening 26A formed in the mask insulating film 26. The top face 55a of the second element isolation insulating film 55 is flush with the top face 26a of the mask insulating film 26. The second element isolation insulating film 55 may be a silicon oxide film (SiO2 film), for example.

The second element isolation regions 17 configured as described above defines a plurality of element formation regions R with respect to the second direction.

Thus, the active region 16 is divided into a plurality of element formation regions R by providing the first element isolation region 14 formed by filling the first element isolation trench 51 formed in the semiconductor substrate 13 with the first element isolation insulating film 52, and the second element isolation region 17 formed by filling the second element isolation trench 54 formed in the semiconductor substrate 13 with the second element isolation insulating film 55. Thus, in comparison with a conventional technique in which a plurality of element formation regions R are defined by providing a dummy gate electrode (not shown) applied with a negative potential in the second element isolation trench 54 via the gate insulating film 21, this configuration of the invention eliminates the risk of the first and second transistors 19-1 and 19-2 being adversely affected by potential of a dummy gate electrode, and hence makes it easy to turn the first and second transistors 19-1 and 19-2 on and off and improves the data holding performance memory cell array 11.

As shown in FIG. 1 and FIGS. 2A and 2B, the gate electrode trench 18 is provided in pair in the semiconductor substrate 13 between two second element isolation regions 17 so as to extend in the Y direction. Each of the gate electrode trenches 18 is defined by the inner surfaces consisting of first and second side faces 18a and 18b facing each other and the bottom 18c. The pair of gate electrode trenches 18 are arranged such that the second side faces 18b face each other.

As shown in FIGS. 2B and 2C, each of the gate electrode trenches 18 is formed such that the depth of the bottom 18c is smaller than the depth of the first and second element isolation trenches 51 and 54 (the depth of the first and second element isolation regions 14 and 17). When the first and second element isolation trenches 51, 54 have a depth of 250 nm, the depth of the gate electrode trenches 18 is preferably set to 150 to 200 nm.

As shown in FIGS. 1 and 2C, the gate electrode trenches 18 are formed to extend across the first element isolation regions 14 and the active regions 16. This means that each of the gate electrode trenches 18 is formed by a series of first trench sections 18A formed in the active regions 16 and second trench sections 18B formed in the first element isolation regions 14.

As shown in FIGS. 2B to 2D, in the gate electrode trench 18, the bottom of the second trench section 18B formed in the first element isolation region 14 constitutes the bottommost portion 18c of the gate electrode trench 18.

As shown in FIGS. 2A to 2D, in the gate electrode trench 18, the bottom of each of the first trench section 18A formed in the active region 16 has the same depth, at its ends facing the second trench sections 18B, as the depth of the bottom of the second trench section 18B. A fin 15 is formed in a central part of the first trench section 18A such that a part of the active region 16 protrudes.

As shown FIGS. 2A to 2D, the fin 15 has a top part 15a and a pair of sides 15b and 15c facing each other.

The top part 15a extends in the direction where the active region 16 extends (first direction). The opposite ends in the extending direction of the top part 15a are arranged in the first trench section 18A to extend between the first side face 18a and the second side face 18b forming the gate electrode trench 18.

The pair of sides 15b and 15c are arranged to be in parallel with the direction in which the active region 16 extends (first direction).

The fin 15 may have a sharp angular shape at the top as shown in FIGS. 2C and 2D, or may be more rounded at the top.

In this embodiment, the height of the fin 15 means, as indicated by the letter H in FIG. 2C, the height as measured vertically from the lowest point of the bottom 18c of the gate electrode trench 18 to the point where the vertical line meets the top part 15a.

When the depth of the gate electrode trench 18 is from 150 to 200 nm, the height H of the fin 15 is preferably in a range of 10 to 40 nm. In other words, the top part 15a of the fin 15 is preferably located at a position that is 100 nm or more deep from the surface of the semiconductor substrate 13.

When the height H of the fin 15 is less than 10 nm, the S factor (subthreshold factor) will be increased, leading to a problem of increased off-leakage current. In addition, this will reduce the current driving ability, leading to a problem of degraded write characteristics. If the height H of the fin 15 exceeds 40 nm, however, the disturb failure described above cannot be suppressed sufficiently.

When the height H of the fin 15 is within the abovementioned range, the increase of off-leakage current can be suppressed and the write characteristics can be improved while suppressing the disturb failure sufficiently.

Referring to FIGS. 2A to 2C, the first and second transistors 19-1 and 19-2 are trench-gate transistors, each having a gate insulating film 21, a gate electrode 22 serving as an embedded word line of a saddle-fin type. an embedded insulating film 24, a first impurity diffusion region 28, and a second impurity diffusion region 29.

As shown in FIGS. 2A and 2B, the first and second transistors 19-1 and 19-2 are arranged adjacent to each other. The second impurity diffusion region 29 functions as a common impurity diffusion region (drain region in the case of the structure as shown in FIGS. 2A and 2B) for the first and second transistors 19-1 and 19-2.

Specifically, the second side face 18b of the gate electrode trench 18 forming the first transistor 19-1 and the second side face 18b of the gate electrode trench 18 forming the second transistor 19-2 are arranged to face each other across the second impurity diffusion region 29.

Referring to FIGS. 2A to 2D, the gate insulating film 21 is formed to cover the first and second side faces 18a, 18b of the gate electrode trenches 18 and the bottoms 18c of the gate electrode trenches 18. The gate insulating film 21 further covers the surfaces (i.e. the top part 15a and the sides 15b and 15c facing each other) of the fin 15 provided on the bottom 18c of each of the gate electrode trenches 18.

The gate insulating film 21 may be, for example, a single-layer silicon oxide film ($SiO_2$ film), a nitrided silicon oxide film (SiON film), a laminated silicon oxide film ($SiO_2$ film), or a laminated film having a silicon nitride film (SiN film) stacked on a silicon oxide film ($SiO_2$ film).

When a single-layer silicon oxide film ($SiO_2$ film) is used as the gate insulating film 21, the gate insulating film 21 can be formed to have an average thickness of 4 to 6 nm, for example.

The inventor has newly found that when the potential of the gate electrode 22 (word line) is changed from on to off, it is difficult for electrons in the fin 15 to return to the diffusion layer serving as a source. If the electrons thus have been accumulated in the fin 15, the electrons in the fin 15 may possibly reach the second impurity diffusion region 28 (drain region) forming the second transistor 19-2 to cause disturb failure, when the gate electrode 22 (word line) corresponding to the first transistor 19-1 is repeatedly turned on and off under previously established conditions in which L-level data is stored in the lower electrode 57 electrically connected to the first transistor 19-1 and H-level data is stored in the lower electrode 57 electrically connected to the second transistor 19-2.

The inventor further has found that the thickness distribution of the gate insulating film 21 can be controlled to control the flow of electrons when the potential of the gate electrode 22 (word line) is turned from on to off, so that migration of the electrons from the fin 15 to the diffusion layer serving as the source can be promoted and accumulation of electrons in the fin 15 can be prevented, resulting in increased operation speed and improved reliability of the transistors.

For example, when the gate insulating film 21 has a relationship represented by $t1>t2$ between a thickness t1 of the first side face 18a and second side face 18b of the gate electrode trench 18 and a thickness t2 of the top part 15a of the fin 15, it is difficult for electrons in the fin 15 to return to the diffusion layer serving as the source when the potential of the gate electrode 22 (word line) is changed from on to off.

More specifically, the amount of electrons in the channel is in an inverse correlation with the thickness of the gate insulating film 21 when the gate electrode 22 (word line) is on. Therefore, when it is assumed that the gate insulating film 21 has a relationship represented by $t1>t2$ between a thickness t1 of the first side face 18a and second side face 18b of the gate electrode trench 18 and a thickness t2 of the top part 15a of the fin 15 in a direction vertical to the surface of the semiconductor substrate 13, many electrons will migrate into the fin 15 when the gate electrode 22 (word line) is on. Therefore, when the potential of the gate electrode 22 is changed from on to off, the amount of electrons to be transferred from the fin 15 to the diffusion layer serving as the source is increased. As a result, the time period required to stabilize the potential of the diffusion layer serving as the source is increased. In such a semiconductor device, it takes a long time to stabilize the potential of the diffusion layer serving as the source, and hence the operation of the transistors is slow. The slow operation of the transistors causes impairment of reliability of the semiconductor device.

In the gate insulating film 21 of the semiconductor device according to the embodiment, therefore, a relationship represented by t1<t2 is set between a thickness t1 of the first side face 18a and second side face 18b of the gate electrode trench 18 shown in FIGS. 2A and 2B and a thickness t2 of the top part 15a of the fin 15 shown in FIG. 2D. When the thicknesses t1 and t2 are in the relationship of t1<t2, the amount of electrons migrating to the fin 15 is suppressed when the gate electrode 22 (word line) is on, and hence the amount of electrons to be transferred from the fin 15 to the diffusion layer serving as the source is reduced when the potential of the gate electrode 22 is changed from on to off. Accordingly, the electrons in the fin 15 are allowed to return to the diffusion layer as the source in a short period of time and hence the potential of the diffusion layer as the source can be stabilized in a short period of time.

When t1 and t2 described above are in the relationship of t1<t2, the difference between t1 and t2 is preferably in the range of 0.5 to 3.0 nm. When the difference between t1 and t2 is within the aforementioned range, the amount of electrons to be transferred from the fin 15 to the diffusion layer serving as the source can be effectively reduced, and the threshold voltage of the transistor can be easily set in a desirable range. Specifically, for example, t1 can be set to 4.0 to 6.0 nm, while t2 can be set to 4.5 to 7.0 nm.

When, for example, t1 is set to 5 nm, and the disturb failure rate when the difference between t1 and t2 is null is normalized as 1, the disturb failure rate is 0.8 when the difference between t1 and t2 is 0.5 nm, 0.5 when the difference between t1 and t2 is 1 nm, and 0.1 when the difference between t1 and t2 is 2 nm. Thus, the disturb failure rate is reduced as the difference between t1 and t2 becomes greater.

When the potential of the gate electrode 22 (word line) is changed from on to off, the electrons in the fin 15 will migrate toward an area with a lower threshold voltage (Vt), and hence migrate from a thicker part of the gate insulating film 21 toward a thinner part of the gate insulating film 21. Accordingly, when for example, a relationship represented by t2>t4>t3 is established among a thickness t2 of the top part 15a of the fin 15, a thickness t3 of the bottoms of the sides 15b and 15c of the fin 15, and a film thickness t4 between t2 and t3, electrons in the fin 15 are allowed to migrate to the bottom of the fin 15 easily. As a result, it becomes difficult for the electrons in the fin 15 to return to the diffusion layer serving as the source, whereby the time period required to stabilize the potential of the diffusion layer is increased and the operation of the transistor becomes slower.

In the concept of this invention, the thickness t3 of the bottoms of the sides 15b and 15c of the fin 15 means, as shown in FIG. 2D, a thickness t3 as measured in a vertical direction to a normal line h3 on the interface between the fin 15 and the gate insulating film 21 at a position shifted from the top part 15a of the fin 15 toward the bottom 18c of the gate electrode trench 18 by a distance corresponding to 90% of the height of the fin 15 (0.9h).

The film thickness t4 between t2 and t3 means a thickness as measured in a vertical direction to a normal line h4 on the interface between the fin 15 and gate insulating film 21 at a position between t2 and t3.

Therefore, in the gate insulating film 21 of the semiconductor device according to this embodiment, as shown in FIG. 2D, a relationship represented by t2≥t4<t3 should be established among the thickness t2 of the top part 15a of the fin 15, the thickness t3 of the bottoms of the sides 15b and 15c of the fin 15, and the film thickness t4 between t2 and t3. When the relationship among t2, t3, and t4 is t2≥t4<t3, the migration of electrons from the bottoms of the sides 15b and 15c to the top part 15a of the fin 15 is promoted when the potential of the gate electrode 22 (word line) is changed from on to off. Accordingly, the migration of electrons from the fin 15 to the diffusion layer serving as the source is facilitated, whereby the potential of the diffusion layer serving as the source can be stabilized in a short period of time and operation of the transistor is improved.

When the relationship among t2, t3, and t4 is represented by t2≥t4<t3, the difference between t4 and t3 is preferably in a range of 0.5 to 3.0 nm. When the difference between t4 and t3 is measured according to the invention, the film thickness t4 between t2 and t3 is defined as a thickness t4 as measured in a vertical direction to the normal line h4 on the interface between the fin 15 and the gate insulating film 21 at a position shifted from the top part 15a of the fin 15 toward the bottom 18c of the gate electrode trench 18 by a distance corresponding to 50% of the height of the fin 15 (0.5h). When the difference between t4 and t3 is within the aforementioned range, migration of electrons from the bottoms of the sides 15b and 15c of the fin 15 to the top part 15a of the fin 15 is promoted effectively, while the threshold voltage of the transistor can be set to a desirable range easily. For example, t4 can be set to a range of 4.5 to 6.0 nm, and t3 can be set to a range of 5.0 to 7.5 nm.

For example, when the operating speed of the transistor under the condition of t2=t4=t3=6 nm is normalized as 1, the operating speed is increased by about 1% when t2 is set to 6 nm, t4 is set to 5.5 nm, and the difference between t4 and t3 is set to 0.5 nm by changing the size of t3. The operating speed is increased by about 2% when the difference between t4 and t3 is set to 1 nm, and is increased by about 5% when the difference between t4 and t3 is set to 2 nm. Further, when t2 and t4 are equally set to 6 nm, and the difference between t4 and t3 is set to 0.5 nm, 1 nm, and 2 nm by changing the size of t3, the operating speed is slightly increased in comparison with the case in which t2 is set to 6 nm, and t4 is set to 5.5 nm.

In the semiconductor device according to the embodiment as described above, the relationship between t1 and t2 of the gate insulating film 21 is t1<t2 and the relationship among t2, t3, and t4 is t2≥t4<t3. Therefore, electrons in the fin 15 are allowed to easily return to the diffusion layer serving as the source when the potential of the gate electrode 22 (word line) is changed from on to off. This prevents the disturb failure caused by accumulation of electrons in the fin 15. Thus, the embodiment of the invention can provide a highly reliable semiconductor device with transistors operating stably.

Although the description of the embodiment has been made in terms of an example in which the relationship between t1 and t2 of the gate insulating film 21 is t1<t2 and the relationship among t2, t3, and t4 is t2≥t4<t3, these two conditions need not necessarily be satisfied at the same time, but either one of them can be satisfied. Specifically, the relationship between t1 and t2 should be t1<t2, or the relationship among t2, t3, and t4 should be t2≥t4<t3. In this case as well, the electrons in the fin 15 are allowed to easily return to the diffusion layer serving as the source when the potential of the gate electrode 22 (word line) is changed from on to off, and thus the disturb failure caused by accumulation of electrons in the fin 15 can be suppressed effectively.

Referring to FIGS. 2A to 2C, a saddle-fin type embedded word line is employed in the gate electrode 22 in order to reduce the off-leakage current and to improve the write characteristics. Employment of the saddle-fin type word line makes it possible to reduce the S factor, and hence the threshold voltage can be reduced while retaining the off-leakage current. Further, employment of the saddle-fin type word line makes it possible to improve the current driving ability, and hence the write characteristics can be improved.

Each of the gate electrodes 22 is arranged to fill a lower part of the gate electrode trench 18 via the gate insulating film 21.

Thus, the gate electrode 22 is formed to stride over the fin 15 via the gate insulating film 21. The top face 22a of the gate electrode 22 is located at a lower level than the principal surface 13a of the semiconductor substrate 13. The gate electrode 22 can be formed, for example, in a laminated structure having a titanium nitride film and a tungsten film stacked sequentially.

In the semiconductor device according to the embodiment, the threshold voltage of each of the first and second transistors 19-1 and 19-2 can be regulated as appropriate by adjusting the film thickness of the gate insulating film 21 and the work function of the gate electrode 22. In the case of a saddle-fin type cell transistor, the threshold voltage should preferably be in a range of 0.5 to 1.0 V. If the threshold voltage is less than 0.5 V, the off-leakage current will be increased, leading to degradation of data retention characteristics.

If the threshold voltage exceeds 1.0 V, however, the current driving ability becomes so low that data writing cannot be done sufficiently, which also possibly leads to degradation of data retention characteristics.

Specifically, the threshold voltage of one or both of the first and second transistors 19-1 and 19-2 can be set to a range of 0.8 to 1.0 V by setting the average thickness of the gate insulating film 21 to a range of 4 to 6 nm (as calculated for a silicon oxide film) and setting the work function of the gate electrode 22 to a range of 4.6 to 4.8 eV.

Referring to FIGS. 2A and 2B, the embedded insulating film 24 is formed to cover the top face 22a of the gate electrode 22 and to fill the gate electrode trench 18 having the gate insulating film 21 formed therein.

Further, the top part of the embedded insulating film 24 protrudes higher than the principal surface 13a of the semiconductor substrate 13, and the top face 24a of this protruding portion is flush with the top face 26a of the mask insulating film 26. The embedded insulating film 24 may be a silicon oxide film ($SiO_2$ film).

Referring to FIGS. 2A and 2B, the mask insulating film 26 is formed on the top face 28a of the first impurity diffusion region 28. The mask insulating film 26 has a trench-like opening 26A formed on the second element isolation trench 54. The mask insulating film 26 functions as an etching mask when the second element isolation trench 54 is formed in the semiconductor substrate 13 by anisotropic etching. A silicon nitride film is used as the mask insulating film 26. In this case, the thickness of the mask insulating film 26 can be 50 nm, for example.

Referring to FIGS. 2A and 2B, a first impurity diffusion region 28 is formed on a part of the semiconductor substrate 13 located on the side of the first side face 18a to cover an upper part 21A of the gate insulating film 21 formed on the first side face 18a of the gate electrode trench 18.

This means that, the first side face 18a of the gate electrode trench 18 forming the first transistor 19-1 and the first side face 18a of the gate electrode trench 18 forming the second transistor 19-2 respectively face the side faces of the second element isolation trenches 54 via the semiconductor substrate 13.

Therefore, each of the first impurity diffusion region 28 is formed to include the top face 13a of the semiconductor substrate 13 interposed between the first side face 18a and the second element isolation trench 54, and to cover the upper part 21A of the gate insulating film 21 formed on the first side faces 18a.

The bottom face 28b of the first impurity diffusion region 28 is located at a higher level than the top face 22a of the gate electrode 22 embedded in the gate electrode trench 18 (at a position closer to the top face 13a of the semiconductor substrate 13). The distance between a horizontal line including the bottom face 28b of the first impurity diffusion region 28 and a horizontal line including the top face 22a of the embedded gate electrode 22 is desirably in a range of 5 to 10 nm. If the distance is less than 5 nm, the junction field becomes so high and that the data retention characteristics will be degraded. In contrast, if the distance exceeds 10 nm, the current driving ability will be reduced, also leading to degradation of write characteristic.

The first impurity diffusion region 28 is provided in each of the gate electrodes 22 forming the first and second transistors 19-1 and 19-2.

The first impurity diffusion regions 28 are impurity diffusion regions functioning as source/drain regions (source regions in case of the configuration shown in FIGS. 2A and 2B) of the first and second transistors 19-1 and 19-2. When the semiconductor substrate 13 is a p-type silicon substrate, the first impurity diffusion regions 28 ae formed by implanting an n-type impurity ion into the semiconductor substrate 13.

Referring to FIGS. 2A and 2B, the second impurity diffusion region 29 is formed in a part of the semiconductor substrate 13 between the two gate electrode trenches 18. More specifically, the second impurity diffusion region is formed such that the second impurity diffusion region 29 is shallower than the bottom 18c of the gate electrode trench 18 and deeper than the apex of the fin 15 (the part of the top face 15a closest to the surface 13a of the semiconductor substrate 13). This means that the bottom of the second impurity diffusion region 29 is located at a level between the apex of the top face 15a of the fin 15 and the bottom 18c of the gate electrode trench 18. In other words, the position of junction between the second impurity diffusion region 29 (e.g. n-type diffusion region) and the semiconductor substrate 13 (e.g. p-type channel) is located in a range between the lower limit of depth defined by the apex of the fin 15 and the upper limit of depth defined by the bottom 18c of the gate electrode trench 18. As a result, the second impurity diffusion region 29 is arranged to cover the entire gate insulating films 21 formed on the second side faces 18b of the two gate electrode trenches 18 except their lower ends.

If the depth of the second impurity diffusion region 29 is shallower than the apex of the fin 15, the problem of the disturb failure will occur. In contrast, if the depth of the second impurity diffusion region 29 is deeper than the bottom 18c of the gate electrode trench 18, the doped impurity (e.g. n-type impurity) will reach the fin 15, and hence the resulting voltage will be lower than a desired threshold voltage (Vt). If the channel concentration (e.g. concentration of p-type impurity) of the semiconductor substrate 13 is increased in order to compensate the reduction of the threshold voltage (Vt), the field intensity at the junction between the first impurity diffusion region 28 (e.g. n-type diffusion layer) and the semiconductor substrate 13 (e.g. p-type channel) will be increased, leading to a problem of degradation of data retention characteristics.

The second impurity diffusion region 29 is an impurity diffusion region functioning as a common source/drain region (drain region in the case of the configuration shown in FIG. 2) for the first and second transistors 19-1 and 19-2. When the semiconductor substrate 13 is a p-type silicon substrate, the second impurity diffusion region 29 is formed by implanting an n-type impurity ion into the semiconductor substrate 13.

The semiconductor device 10 according to the embodiment is provided with the first impurity diffusion region 28 and the second impurity diffusion region 29. The first impurity diffusion region 28 has the fins 15 formed at the bottoms 18c of the gate electrode trenches 18, includes the top face 13a of the semiconductor substrate 13 interposed between the first side face 18a and the second element isolation trench 54, and covers the upper part 21A of the gate insulating film 21 formed on the first side face 18. The second impurity diffusion region 29 is arranged in a part of the semiconductor substrate 13 located between the two gate electrode trenches 18, and covers the entire of the gate insulating film 21 formed on the second side faces 18b of the gate electrode trenches 18 except their lower ends. In this manner, when the first and second transistors 19-1 and 19-2 operate, a first channel region is formed in the fins 15 while a second channel region is formed in the semiconductor substrate 13 in contact with the lower part of the gate insulating film 21 formed on the first side face 18a, in the semiconductor substrate 13 in contact with the bottoms 18c of the gate electrode trenches 18, and in the semiconductor substrate 13 located at a lower level than the bottom of the second impurity diffusion region 29 formed on the second side face 18b. In this manner, no channel region is formed in the part of the semiconductor substrate 13 that is in contact with the second side face 18b and located at an upper level than the bottom the second impurity diffusion region 29.

Stated differently, when the first and second transistors 19-1 and 19-2 are turned on, the fins 15 which are completely depleted shows lower resistance than related transistors and allows electric current to flow therethrough more easily. This makes it possible to reduce the channel resistance and increase the on current even in miniaturized memory cells.

When one of the first and second transistors 19-1 and 19-2 operates, the risk of erroneous operation of the other transistor can be suppressed.

Accordingly, even if the semiconductor device 10 is miniaturized and the gate electrodes 22 are arranged at narrow pitches, the first and second transistors 19-1 and 19-2 are allowed to operate independently and stably.

Additionally, the fin 15 is formed in the bottom 18c of each of the two gate electrode trenches 18 adjacent to each other such that the height H of the fin 15 is 40 nm or less. When the gate electrode 22 (word line) corresponding to the first transistor 19-1 is repeatedly turned on and off in the state in which L-data is stored in the lower electrode 57 electrically connected to the first transistor 19-1 while H-data is stored in the lower electrode 57 electrically connected to the second transistor 19-2, electrons e-generated in the channel of the first transistor 19-1 can be prevented from reaching the second impurity diffusion region 28 (drain region) forming the second transistor 19-2.

In this manner, the electrons e– generated in the channel of the first transistor 19-1 will not corrupt the H-level data stored in the lower electrode 5 electrically connected to the second transistor 19-2 and change it to L-level data. Accordingly, the occurrence of disturb failure can be prevented in which the stored data in one of the adjacent cells is changed due to an operation state of the other cell.

The occurrence of the disturb failure can be prevented even in a DRAM in which the distance between two adjacent gate electrodes 22 is 50 nm or less.

Referring to FIGS. 2A and 2B, the opening 32 is formed between the embedded insulating films 24 protruding from the two gate electrode trenches 18. The opening 32 is formed so as to expose the top face 29a of the second impurity diffusion region 29.

Referring to FIGS. 2A and 2B, a bit line contact plug 33 is formed to fill the opening 32 and formed integrally with the bit line 34. The lower end of the bit line contact plug 33 is in contact with the top face 29a of the second impurity diffusion region 29. When the bit line 34 is formed of a laminated film formed by sequentially stacking a polysilicon film, a titanium nitride (TiN) film and a tungsten (W) film, the bit line contact plug 33 can be formed of a polysilicon film.

Referring to FIGS. 2A and 2B, the bit line 34 is provided on the top face 24a of the embedded insulating film 24 and is formed integrally with the bit line contact plug 33. Thus, the bit line 34 is electrically connected to the second impurity diffusion region 29 via the bit line contact plug 33.

The bit line 34 can be formed of a laminated film composed a polysilicon film, a titanium nitride film and a tungsten film sequentially stacked, a polysilicon film, a titanium nitride film, or the like.

Referring to FIGS. 2A and 2B, the cap insulating film 36 is formed to cover the top face of the bit line 34. The cap insulating film 36 not only protects the top face of the bit line 34 but also functions as an etching mask when a base material for the bit line 34 is patterned by anisotropic etching (specifically, by drying etching). The cap insulating film 36 may be a silicon nitride film (SiN film).

Referring to FIGS. 2A and 2B, the sidewall film 37 is formed to cover each side face of the bit line 34. The sidewall film 37 has a function to protect the side walls of the bit line 34. The sidewall film 37 may be a laminated film composed of a silicon nitride film (SiN film) and a silicon oxide film (SiO2 film) sequentially stacked.

Referring to FIGS. 2A and 2B, the interlayer insulating film 38 is formed on the top face 26a of the mask insulating film 26 and on the top face 55a of the second element isolation insulating film 55. The top face 38a of the interlayer insulating film 38 is flush with the top face 36 of the cap insulating film 36. The interlayer insulating film 38 may be, for example, a silicon oxide film ($SiO_2$ film) formed by a CVD method, or a coat-type insulating film (silicon oxide film ($SiO_2$ film)) formed by a SOG (Spin on Glass) method.

Referring to FIGS. 2A and 2B, the contact hole 41 is formed in the embedded insulating film 24, the mask insulating film 26, and the interlayer insulating film 38 so as to expose part of the top face 28a of the first impurity diffusion region 28.

Referring to FIGS. 2A and 2B, the capacity contact plug 42 is formed to fill the contact hole 41. The lower end of the capacity contact plug 42 is in contact with a part of the top face 28a of the first impurity diffusion region 28. Thus, the capacity contact plug 42 is electrically connected to the first impurity diffusion region 28. The top face 42a of the capacity contact plug 42 is flush with the top face 38a of the interlayer insulating film 38. The capacity contact plug 42 may be of a laminated structure consisting, for example, of a titanium nitride film and a tungsten film sequentially stacked.

Referring to FIGS. 2A and 2B, the capacity contact pad 44 is formed on the top face 38a of the interlayer insulating film 38 such that a part of the capacity contact pad 44 is connected to the top face 42a of the capacity contact plug 42. The lower electrode 57 forming the capacitor 48 is connected onto the capacity contact pad 44. Thus, the capacity contact pad 44 electrically connects the capacity contact plug 42 and the lower electrode 57.

Referring to FIG. 1, the capacity contact pads 44 are of a circular shape and are arranged in a staggered fashion with respect to the capacity contact plugs 42 which are aligned in the Y direction. These capacity contact pads 44 are each arranged between adjacent bit lines 34 in the X direction.

Specifically, the capacity contact pads 44 are arranged in a staggered fashion such that the centers of the alternate capacity contact pads 44 are arranged on the gate electrodes 22 along Y direction, or such that the centers of the alternate capacity contact pads 44 are arranged above the side faces of the gate electrodes 22 along Y direction. In other words, the capacity contact pads 44 are arranged in a zigzag manner in the Y direction.

Referring to FIGS. 2A and 2B, the silicon nitride film 46 is formed on the top face 38a of the interlayer insulating film 38 so as to surround the periphery of the capacity contact pad 44.

One capacitor 48 is provided on each of the capacity contact pads 44.

Each of the capacitors 48 has one lower electrode 57, a capacity insulating film 58 common for a plurality of lower electrodes 57, and an upper electrode 59 common for a plurality of lower electrode 57.

The lower electrode 57 is formed on the capacity contact pad 44 and connected to the capacity contact pad 44. The lower electrode 57 is of a crown shape.

The capacity insulating film 58 is formed to cover the surfaces of the plurality of lower electrodes 57 exposed from the silicon nitride film 46 and the top face of the silicon nitride film 46.

The upper electrode 59 is formed to cover the surface of the capacity insulating film 58. The upper electrode 59 is arranged to fill the inside of each lower electrode 57 having the capacity insulating film 58 formed thereon, and the space between the lower electrodes 57. The top face 59a of the upper electrode 59 is located at a higher level than the upper ends of the lower electrodes 57.

The capacitor 48 configured as described above is electrically connected to the first impurity diffusion region 28 via the capacity contact pad 44.

There may be further provided an interlayer insulating film (not shown) covering the top face 59a of the upper electrode 59, a contact plug (not shown) formed within the interlayer insulating film, and wiring (not shown) connected to the contact plug.

The semiconductor device 10 according to the embodiment of the invention has a configuration as described below. The semiconductor device 10 includes a plurality of first element isolation regions 14 formed of a semiconductor substrate 13 and formed in the semiconductor substrate 13 so as to extend in a first direction and each defining an active region 16 having a plurality of element formation regions R; a plurality of second element isolation regions 17 formed in the semiconductor substrate 13 so as to extend in a second direction intersecting with the first direction and defining each of the active regions 16 into a plurality of element formation regions R; a pair of gate electrode trenches 18 formed in a surface layer of the semiconductor substrate 13 between the adjacent second element isolation regions 17 and 17 so as to extend in the second direction intersecting with the first element isolation regions 14 and the active regions 16, and having first and second side faces 18a and 18b facing each other and the bottom 18c; fins 15 each formed such that a part of the active region 16 protrudes from the bottom 18c of the gate electrode trench 18 by forming the gate electrode trench 18 such that second trench section 18B of the gate electrode trench 18 formed in the first element isolation region 14 is deeper than a first trench section 18A formed in the active region 16, while a part of the first trench section 18A facing the second trench section 18B has substantially the same depth as that of the second trench section 18B; a gate insulating film 21 covering the surfaces of the gate electrode trenches 18 and the fins 15; a pair of gate electrodes 22 formed so as to stride over the fins 15 via the gate insulating film 21 by being embedded in the lower parts of the pair of gate electrode trenches 18; two first impurity diffusion regions 28 and 28 formed on the top face 13a of the semiconductor substrate 13 between the second element isolation regions 17 and the gate electrode trenches 18 and connected to the capacitor 48; and one second impurity diffusion region 29 formed on the semiconductor substrate 13 between the pair of gate electrode trenches 18 and 18 whose second side faces 18b and 18b face each other, and connected to the bit line 34. The element formation regions R share the second impurity diffusion region 29. The semiconductor device 10 has a first transistor 19-1 which is composed, at least, of one of the gate electrodes 22, one of the fins 15 and one of the first impurity diffusion regions 28, and a second transistor 19-2 which is composed, at least, of the other gate electrode 22 and fin 15 and the first impurity diffusion region 28.

The second impurity diffusion region 29 is formed to be shallower than the bottoms 18c of the gate electrode trenches 18 and deeper than the apexes (tops) of the fins 15.

The semiconductor device 10 according to the embodiment is configured such that a fin 15 is provided at the bottom 18c of each of the gate electrode trenches 18, while the semiconductor device 10 is provided with the first impurity diffusion regions 28 including the top face 13a of the semiconductor substrate 13 between the first side faces 18a and the second element isolation trenches 54, and covering the upper parts 21A of the gate insulating films 21 arranged on the first side faces 18a, and the second impurity diffusion region 29 arranged at a part of the semiconductor substrate 13 sandwiched between the two gate electrode trenches 18 and covering the entire of the gate insulating film 21 arranged on the second side faces 18b of the pair of gate electrode trenches 18 except lower parts of the gate insulating film 21. This makes it possible that the semiconductor device 10 is configured such that, when the first and second transistors 19-1 and 19-2 operate, the first channel region is formed in the fin 15, while the second channel region is formed in a part of the semiconductor substrate 13 in contact with the lower parts of the gate insulating films 21 formed on the first side faces 18a, in a part of the semiconductor substrate 13 in contact with the bottom faces 18c of the gate electrode trenches 18, and in a part of the semiconductor substrate 13 located at a lower level than the bottom of the second impurity diffusion region 29 arranged on the second side faces 18b, whereas no channel region is provided in the part of the semiconductor substrate 13 that is in contact with the second side faces 18b and located at a higher level than the bottom of the second impurity diffusion region 29.

Manufacturing Method of Semiconductor Device

A manufacturing method of the semiconductor device 10 (more specifically, the memory cell array 11) of this embodiment will be described with reference to FIG. 3 to FIG. 14.

As described above, figure numbers with suffix "A" each represent a front view. Those figure numbers with suffix "B" are cross-sectional views taken along the line A-A in FIG. 1, those with suffix "C" are cross-sectional views taken along the line B-B in FIG. 1, and those with suffix "D" are cross-sectional views taken along the line C-C in FIG. 1. Of the drawings showing successive steps, any redundant drawings relating to the same structure will be omitted. When a figure with suffix "B" is the same as a figure with suffix "C", the figure with suffix "C" is omitted. For example, when FIG. 3B is the same as FIG. 3C, FIG. 3C is omitted.

The cross-sectional view taken along the line C-C shows a cross-section taken along a direction in which the gate electrode 22 serving as an embedded word line of the semiconductor device 10 according to the embodiment.

Figure 3A:
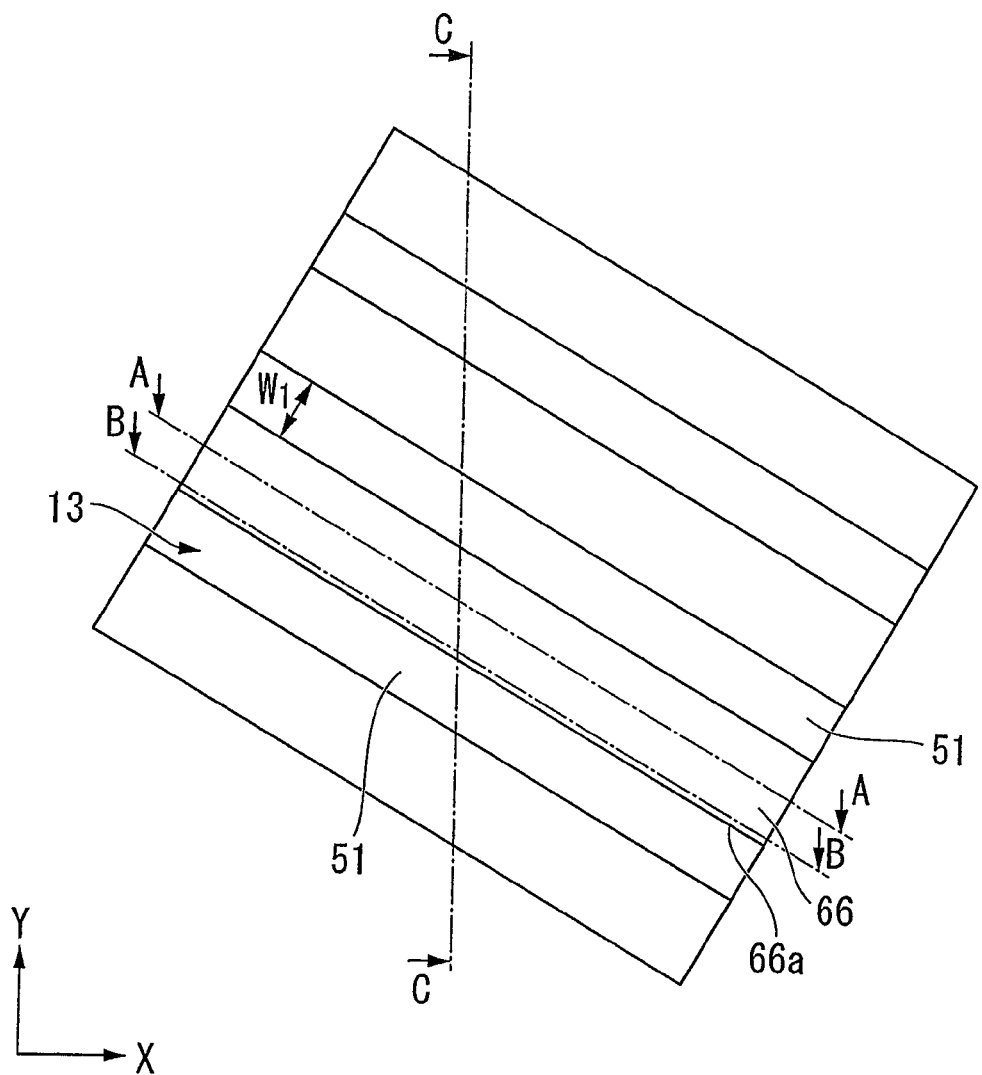
FIG. 3A is diagram illustrating a manufacturing step (step 1) of a memory cell array provided in the semiconductor device according to the embodiment of the invention and is a plan view showing a region where the memory cell array is formed.
Figure 3B:
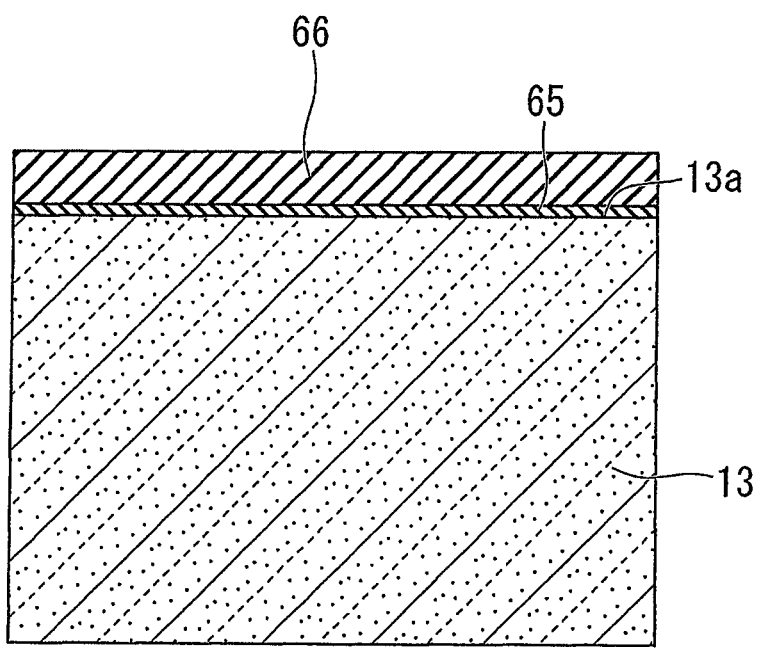
FIG. 3B is a cross-sectional view of the structure shown in FIG. 3A taken along the line A-A in FIG. 3A.
Figure 3D:
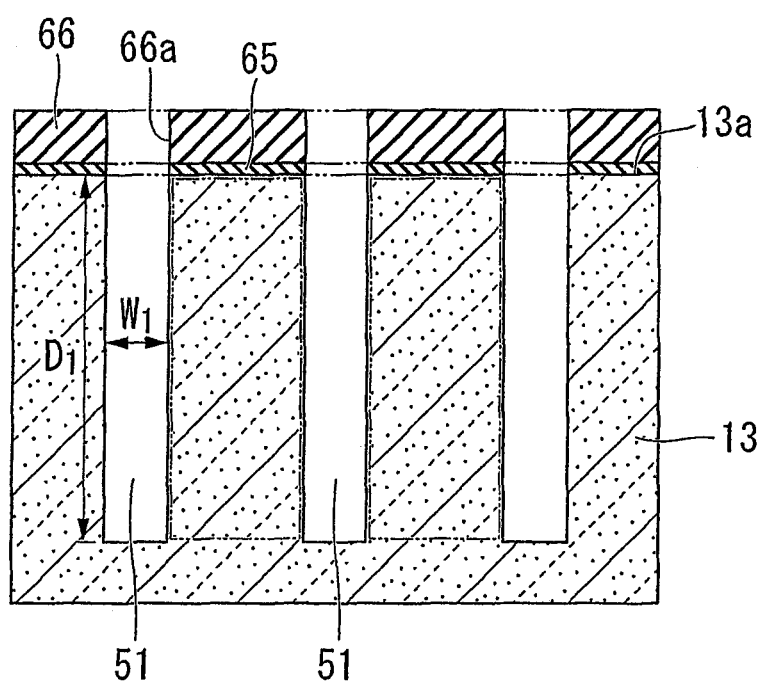
FIG. 3D is a cross-sectional view of the structure shown in FIG. 3A taken along the line C-C in FIG. 3A.

In the step shown in FIGS. 3A, 3B and 3D, a pad oxide film 65 is formed on the principal surface 13a of the semiconductor substrate 13. Subsequently, a silicon nitride film 66 having trench-like openings 66a is formed on the pad oxide film 65.

As shown in FIG. 3A, the opening 66a extends in a strip-like fashion in a direction inclined at a predetermined angle (first direction) relative to the X direction, and is formed in a plurality at predetermined intervals in the Y direction.

Then, as shown in FIG. 3D, the semiconductor substrate 13 is etched by anisotropic etching, using the silicon nitride film 66 having the openings 66a as a mask, so that first element isolation trenches 51 extending in the first direction are formed. The first element isolation trench 51 may have a width W1 of 43 nm, for example. A depth D1 of the first element isolation trenches 51 (a depth as measured from the principal surface 13a of the semiconductor substrate 13) may be 250 nm, for example.

Figure 4D:
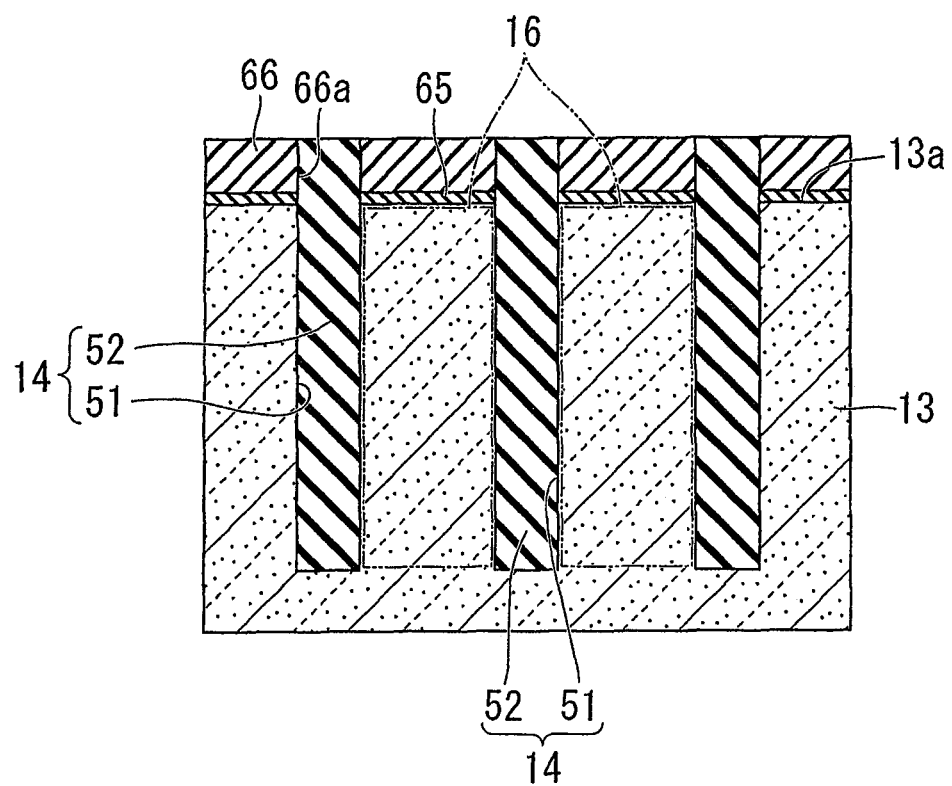
FIG. 4D is a diagram illustrating a manufacturing step (step 2) of the memory cell array provided in the semiconductor device according to the embodiment of the invention, following the manufacturing step shown in FIG. 3D.

In the step shown in FIG. 4D, a first element isolation insulating film 52 is formed to fill the first element isolation trenches 51.

Specifically, the first element isolation trenches 51 are filled with a silicon oxide film ($SiO_2$ film) formed by a HDP (High Density Plasma) method or SOG (Spin on Glass) method.

Parts of the silicon oxide film ($SiO_2$ film) present on and protruding over the top face of the silicon nitride film 66 are removed by a CMP (Chemical Mechanical Polishing) method, whereby the first element isolation insulating films 52 are formed in the first element isolation trenches 51.

Thus, first element isolation regions 14 are formed, each consisting of the first element isolation trench 51 and the first element isolation insulating film 52 and defining a strip-like active region 16 extending in the first direction.

Figure 5D:
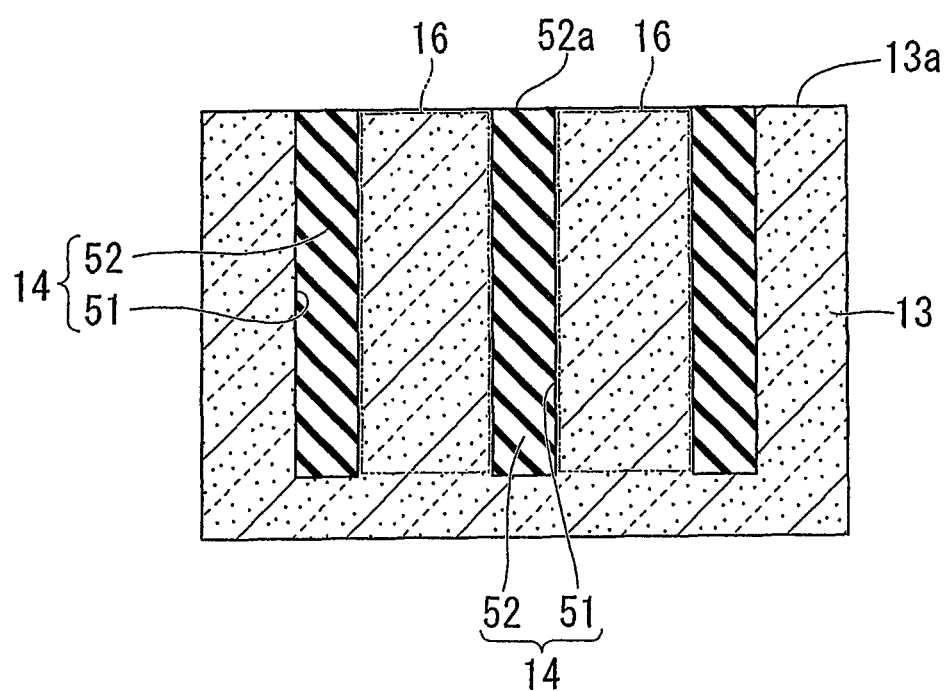
FIG. 5D is a diagram illustrating a manufacturing step (step 3) of the memory cell array provided in the semiconductor device according to the embodiment of the invention, following the manufacturing step shown in FIG. 4D.

In the step shown in FIG. 5D, the silicon nitride film 66 shown in FIG. 4D is removed, and then the pad oxide film 65 is removed by wet etching. Thus, the top face 52a of the first element isolation insulating film 52 is made flush with the principal surface 13a of the semiconductor substrate 13 by removing the parts projecting above the principal surface 13a of the semiconductor substrate.

Figure 6A:
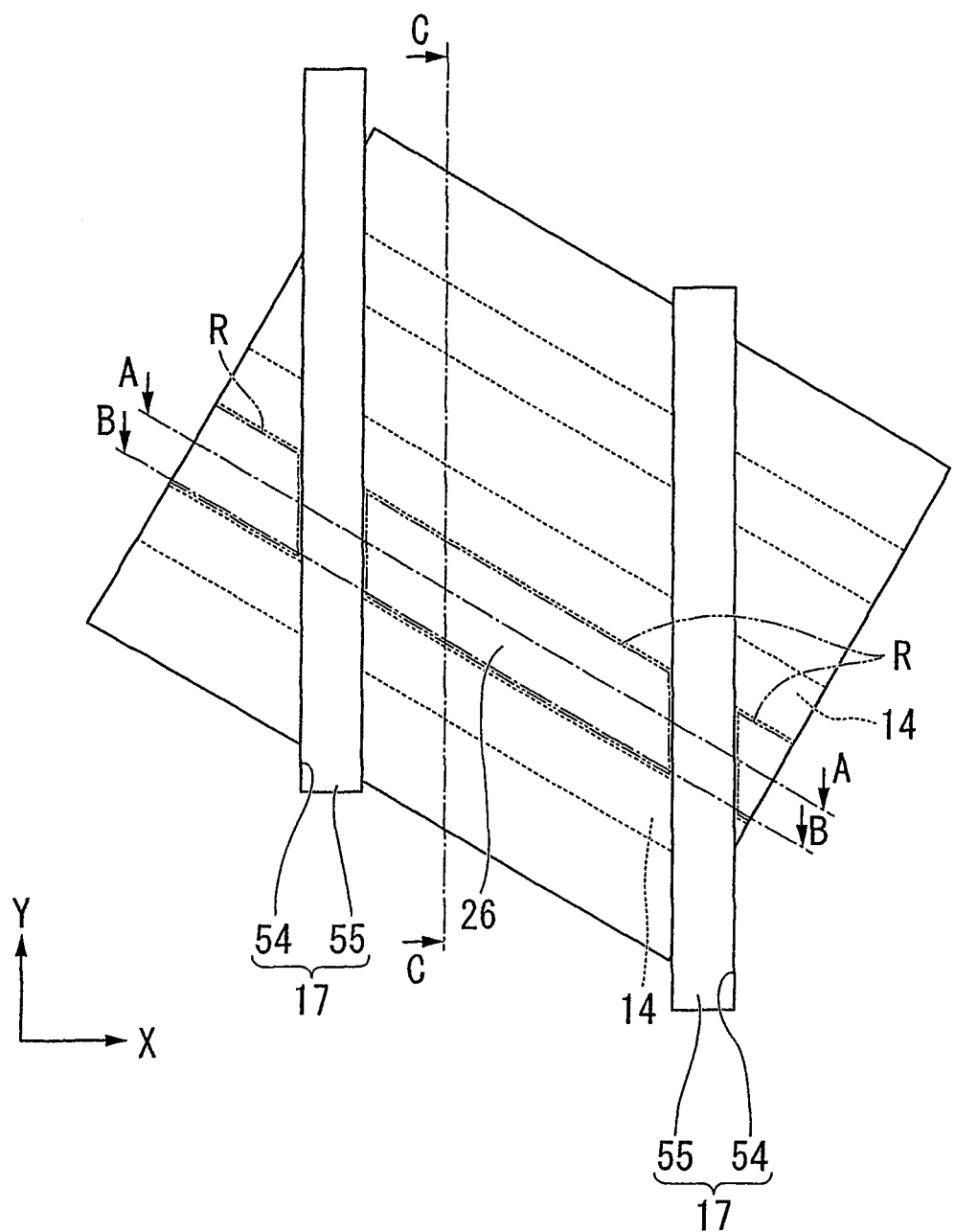
FIG. 6A is a diagram illustrating a manufacturing step (step 4) of the memory cell array provided in the semiconductor device according to the embodiment of the invention, and is a plan view showing a region where the memory cell array is formed.
Figure 6B:
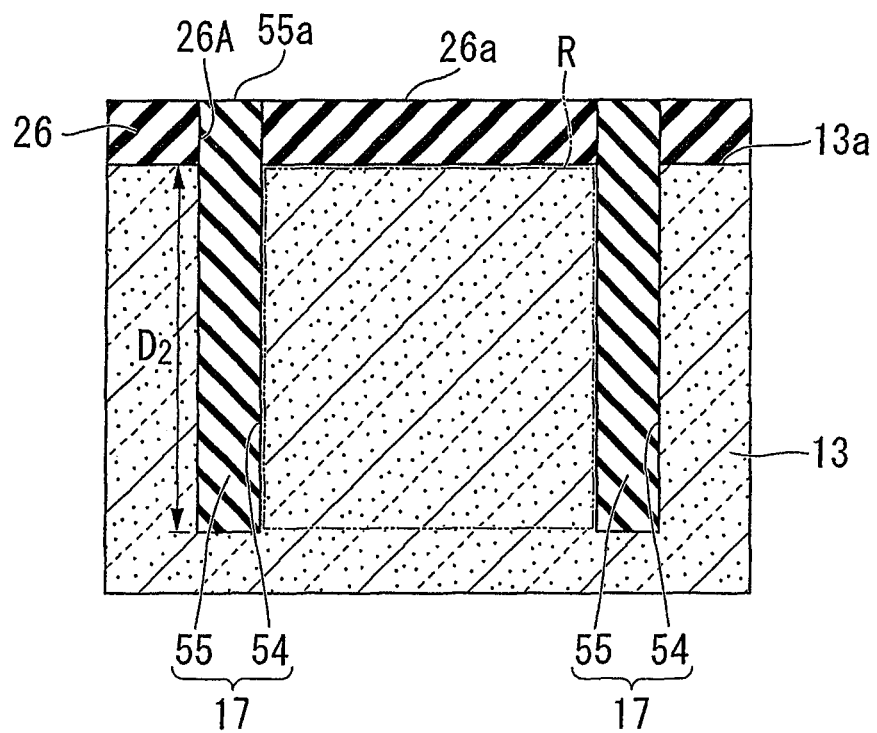
FIG. 6B is a cross-sectional view of the structure shown in FIG. 6A taken along the line A-A thereof.
Figure 6D:
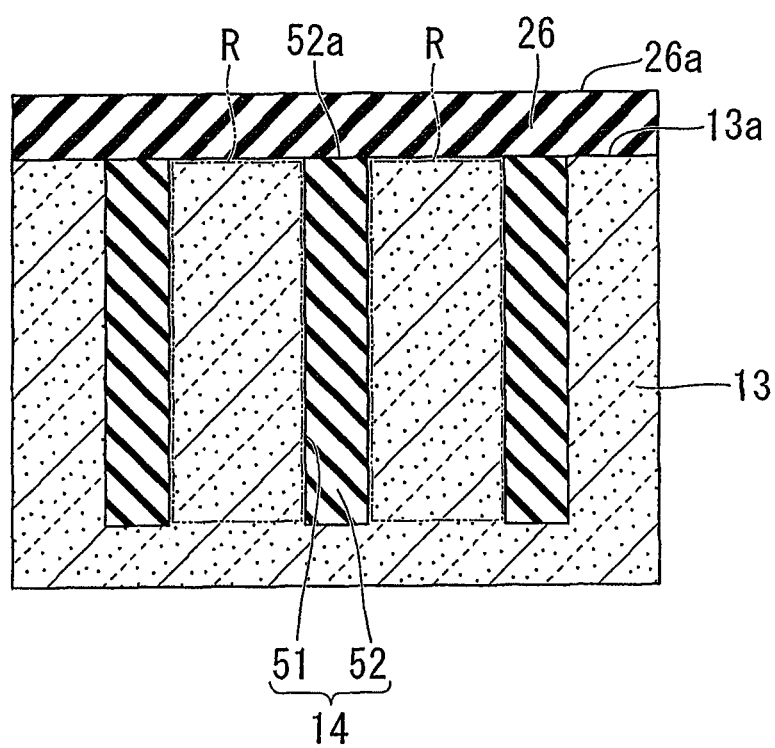
FIG. 6D is a cross-sectional view of the structure shown in FIG. 6A taken along the line C-C thereof.

In the step shown in FIGS. 6A, 6B and 6D, a mask insulating film 26 formed of a silicon nitride film having a trench-like opening 26A is formed on the principal surface 13a of the semiconductor substrate 13 and the top face 52a of the first element isolation insulating film 52 shown in FIG. 5D. The opening 26A extends in the Y direction (second direction) and formed in plurality at predetermined intervals with respect to the X direction (see FIG. 6A). The openings 26A is formed to expose parts of the principal surface 13a of the semiconductor substrate 13 corresponding to regions where second element isolation trenches 54 are formed.

Subsequently, the second element isolation trenches 54 extending in the first direction are formed by anisotropically dry etching the semiconductor substrate 13, using the mask insulating film 26 having the openings 26A as a mask. A depth D2 of the second element isolation trenches 54 (as measured from the principal surface 13a of the semiconductor substrate 13) may be 250 nm, for example. Although, in this example, only the parts of the semiconductor substrate 13 exposed in the openings 26A are etched to form the second element isolation trenches 54, the second element isolation trenches 54 may be formed by simultaneously etching the first element isolation insulating film 52 adjacent to the semiconductor substrate 13.

Subsequently, a second element isolation insulating film 55 formed of a silicon oxide film is formed to fill the second element isolation trenches 54s.

Subsequently, a part of the insulating film protruding above the top face 26a of the mask insulating film 26 is removed by a CMP method, whereby second element isolation trenches 54 are filled, and a second element isolation insulating film 55 having a top face 55a flush with the top face 26a of the mask insulating film 26 is formed.

In this manner, the second element isolation regions 17 are formed, each consisting of the second element isolation trench 54 and the second element isolation insulating film 55 and defining a strip-like active region 16 into a plurality of element formation regions R shown in FIG. 3A.

Figure 7A:
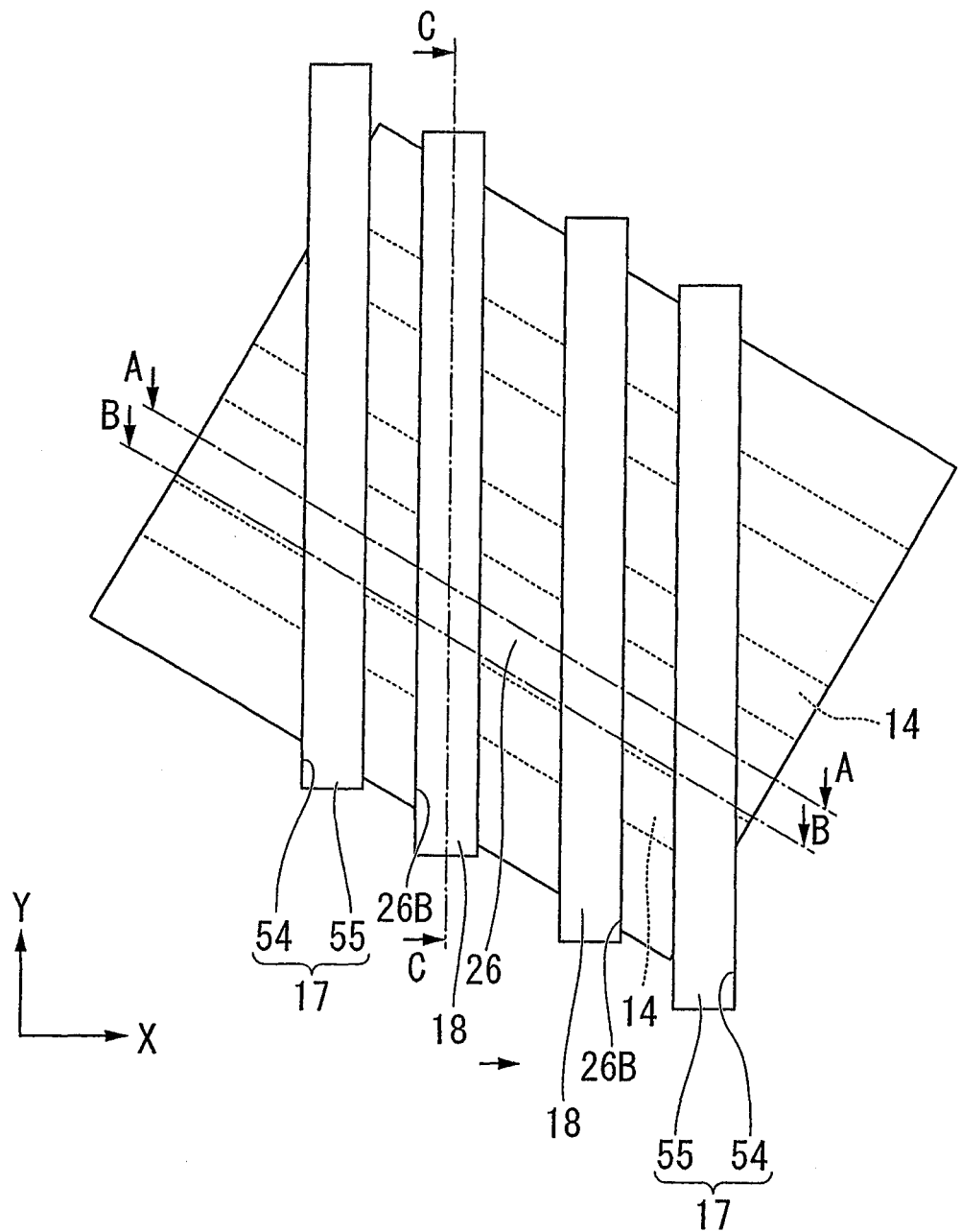
FIG. 7A is a diagram illustrating a manufacturing step (step 5) of the memory cell array provided in the semiconductor device according to the embodiment of the invention, and is a plan view showing a region where the memory cell array is formed.
Figure 7B:
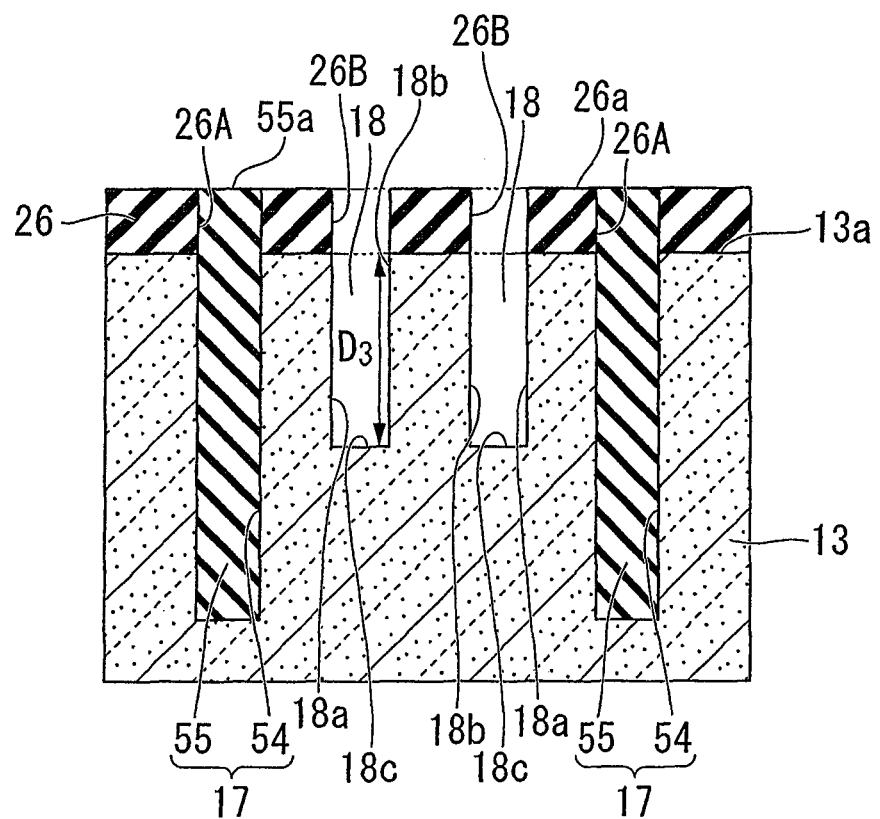
FIG. 7B is a cross-sectional view showing the structure shown in FIG. 7A taken along the line A-A thereof.
Figure 7D:
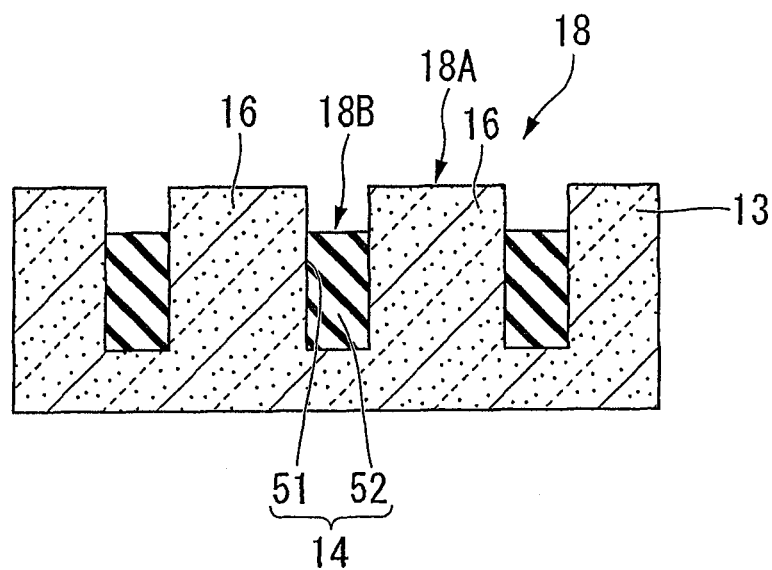
FIG. 7D is a cross-sectional view showing the structure shown in FIG. 7A taken along the line C-C thereof.

In the step shown in FIGS. 7A, 7B and 7D, two trench-like openings 26B extending in the Y direction are formed in the mask insulating film 26 located between the two second element isolation regions 17.

Subsequently, as shown in FIGS. 7B and 7D, the element isolation insulating film 52 forming the first element isolation regions 14 is selectively etched by anisotropic dry etching, using the mask insulating film 26 having the openings 26B as a mask, whereby a second trench section 18B of a gate electrode trench 18 is formed in each of the first element isolation regions 14. The second trench section 18B should be formed such that the depth D4 thereof (the depth as measured from the principal surface 13a of the semiconductor substrate 13, not shown) is smaller than depths D1 and D2 of the first and second element isolation trenches 51 and 54. Specifically, when the depths D1 and D2 of the first and second element isolation trenches 51 and 54 are 250 nm, for example, the depth D4 may be in a range of 150 to 200 nm.

The semiconductor substrate 13 forming the active regions 16 is then selectively etched. Thus, a first trench section 18A of the gate electrode trench 18 is formed in the active region 16, and such that the depth D3 of the first trench section 18A (the depth as measured from the principal surface 13a of the semiconductor substrate 13) is smaller than the depth D4 of the second trench section 18B. Specifically, the first trench section 18A should be formed such that depth D3 thereof is smaller than the depth D4 of the second trench section 18B by 10 to 40 nm. When the depths D1 and D2 of the first and second element isolation trenches 51 and 54 are 250 nm, the depth D4 of the gate electrode trench 18 may be 150 nm, for example.

Figure 8B:
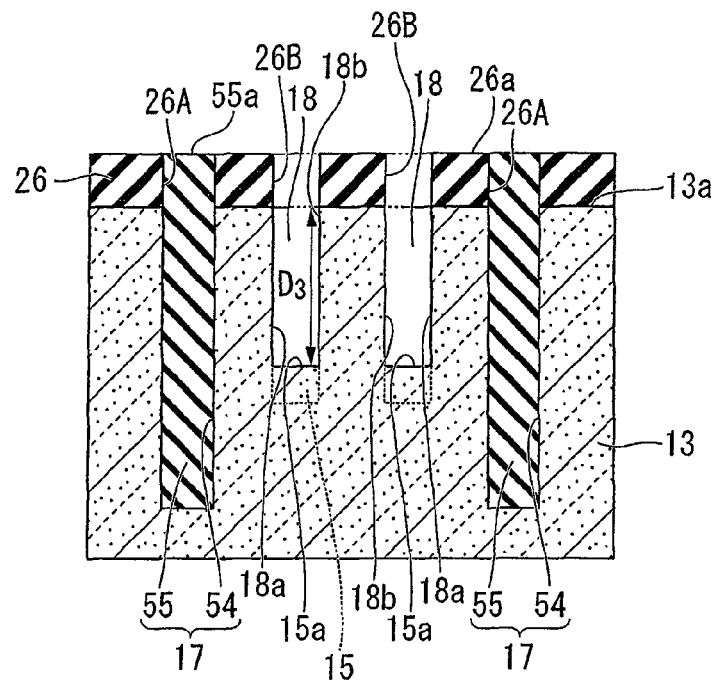
FIG. 8B is a diagram illustrating a manufacturing step (step 6) of the memory cell array provided in the semiconductor device according to the embodiment of the invention and is a cross-sectional view showing another example of the structure shown in FIG. 7A taken along the line A-A thereof.
Figure 8C:
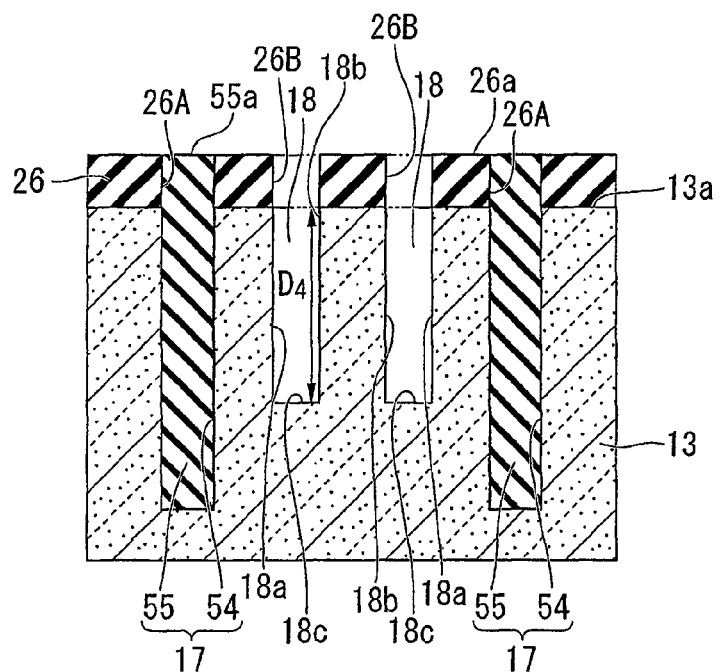
FIG. 8C is a cross-sectional view of the structure shown in FIG. 7A taken along the line B-B thereof.
Figure 8D:
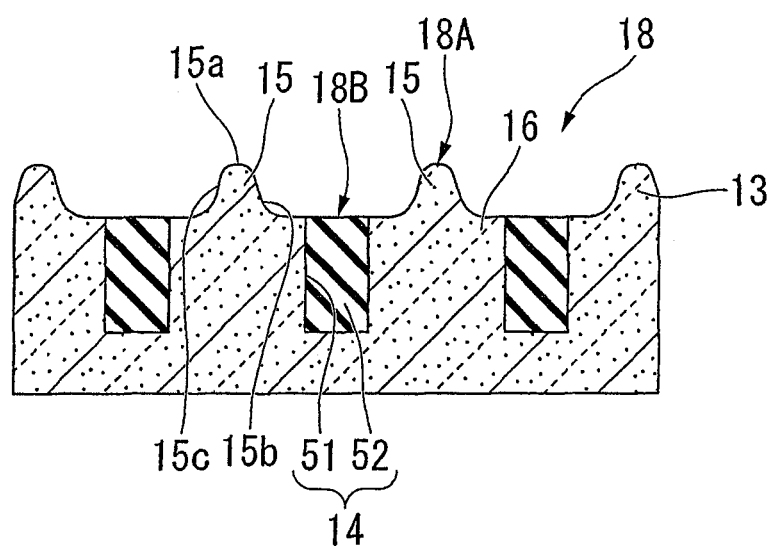
FIG. 8D is a cross-sectional view showing another example of the structure shown in FIG. 7A taken along the line C-C thereof.

In the step shown in FIGS. 8B to 8D, selective anisotropic etching is performed using the mask insulating film 26 having the openings 26B as a mask until the depth of a part of the first trench section 18A forming the gate electrode trench 18 and facing the second trench section 18B becomes substantially the same as the depth of the second trench section 18B.

In this manner, the first trench section 18A of the gate electrode trench 18 that is formed in the active region 16 can be formed such that the depth at the ends thereof facing the second trench section 18B is the same as the depth of the second trench section 18B (i.e. the depth D4) (see FIGS. 8C and 8D), and such that a central part of the first trench section 18A has the depth D3 (see FIGS. 8B and 8D). Thus, the gate electrode trenches 18 each having the first and second side faces 18a and 18b and the bottom 18c can be formed, and each of the fins 15 can be formed such that a part of the active region 16 protrudes from the bottom 18c.

Figure 9B:
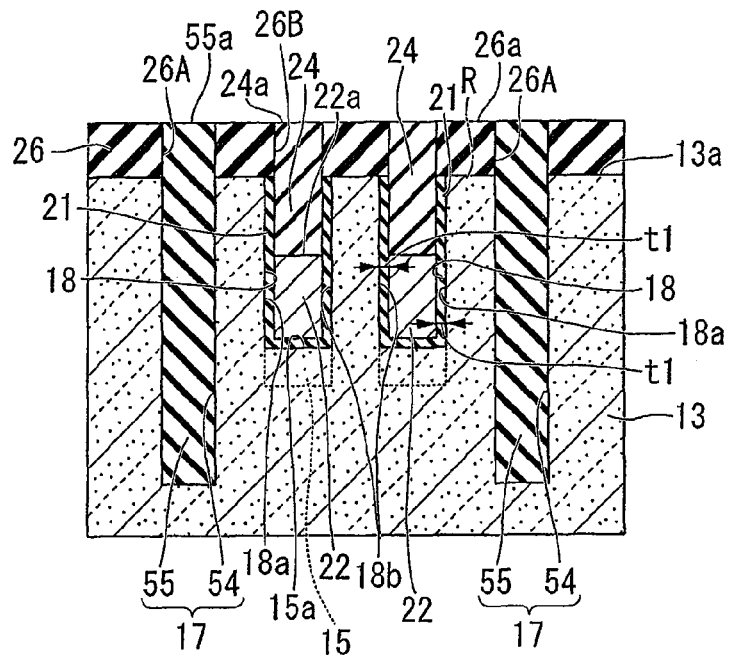
FIG. 9B is a diagram illustrating a manufacturing step (step 7) of the memory cell array provided in the semiconductor device according to the embodiment of the invention and is a cross-sectional view showing another example of the structure shown in FIG. 7A taken along the line A-A thereof.
Figure 9C:
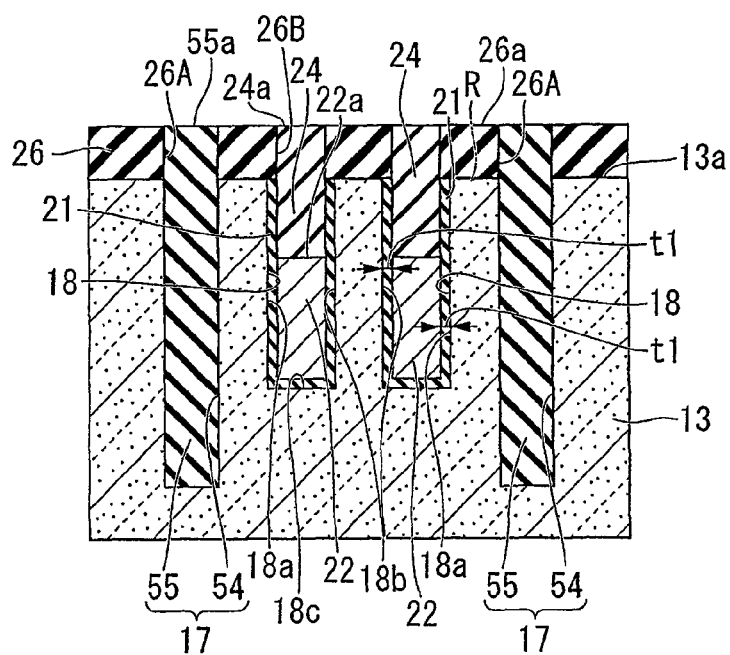
FIG. 9C is a cross-sectional view showing another example of the structure shown in FIG. 7A taken along the line B-B thereof.
Figure 9D:
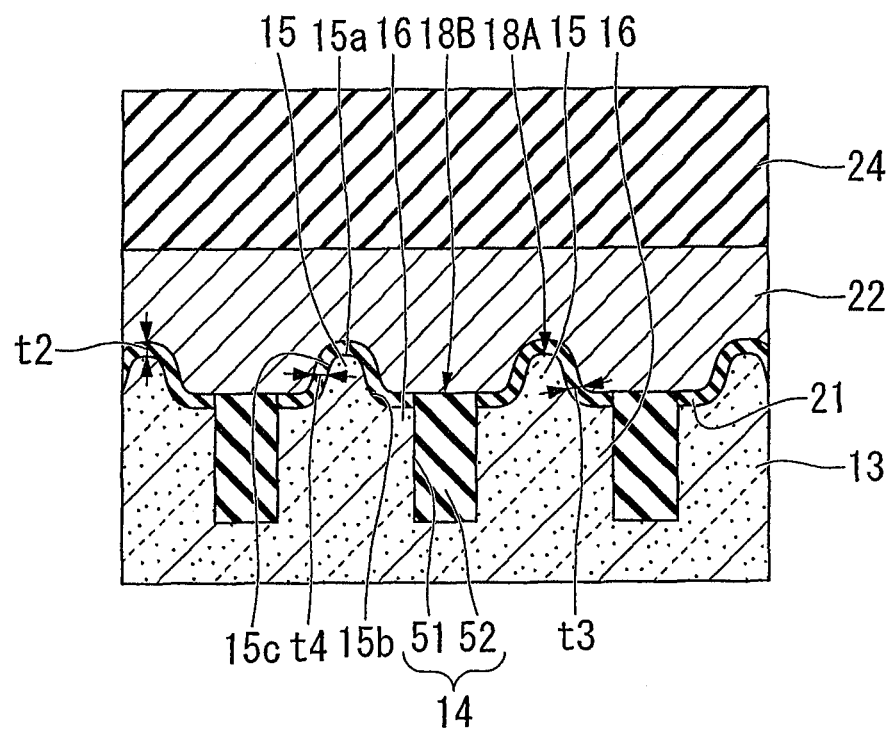
FIG. 9D is a cross-sectional view showing another example of the structure shown in FIG. 7A taken along the line C-C thereof.

In the step shown in FIGS. 9B to 9D, a gate insulating film 21 is formed to cover the surfaces of the gate electrode trenches 18 (i.e. the first and second side faces 18a and 18b, and the bottom faces 18c of the gate electrode trenches 18) and the surfaces of the fins 15 (i.e. the top part 15a and a pair of side faces 15b and 15c facing each other of each fin 15).

The gate insulating film 21 may be, for example, a single-layer silicon oxide film ($SiO_2$ film), a nitrided silicon oxide film (SiON film), a laminated silicon oxide film ($SiO_2$ film), and a laminated film having a silicon nitride film (SiN film) stacked on a silicon oxide film (SiO$_2$ film).

In this embodiment, the formation of the gate insulating film 21 having controlled thickness distribution can be realized, for example, by a method using a low-energy plasma oxidation processing apparatus capable of applying a bias voltage by RF power control. Plasma oxidation processing can be performed, for example, under conditions in which temperature is set in a range of 400 to 600° C., pressure is set in a range of 10 to 200 Pa, an Ar-based gas mixture with an oxygen partial pressure of 0.5 to 5% is used, and RF power is set in a range of 0.1 to 1 kW. In order to obtain the thickness distribution of the gate insulating film 21 in the range as defined in the invention under these conditions, it is preferable to set the pressure in a range of 10 to 30 Pa, the oxygen partial pressure in a range of 0.5 to 1.5%, and the RF power in a range of 0.5 to 0.7 kW.

Even during low-energy plasma oxidation processing, a level is possibly generated at the interface between the gate insulating film and the surfaces of the gate electrode trenches 18 and fins 15 due to the effect of bias application. In order to avoid this effect, ordinary thermal oxidation may be performed after the plasma oxidation processing to inactivate the level.

In this manner, the gate insulating film 21 can be obtained to satisfy the conditions that the relationship between the thickness t1 of the first side faces 18a and second side faces 18b of the gate electrode trenches 18 and the thickness t2 of the top parts 15a of the fins 15 is represented by t1<t2 and/or the relationship among the thickness t2, the thickness t3 of the bottoms of the side faces 15b and 15c of the fins 15, and a film thickness t4 between t2 and t3 is represented by t2≥t4<t3.

Subsequently, gate electrodes 22 are formed to fill the lower parts of the gate electrode trenches 18 via the gate insulating film 21 so as to stride over the fins 15, such that the top faces 22a of the gate electrodes 22 are lower than the principal surface 13a of the semiconductor substrate 13 (see FIG. 9D).

More specifically, the gate electrodes 22 are formed by sequentially stacking a titanium nitride film and a tungsten film by a CVD method, for example, and then totally etching back the titanium nitride film and the tungsten film. Each of the gate electrodes 22 forms a word line of memory cells.

Subsequently, an embedded insulating film 24 formed of a silicon nitride film is formed to cover the top faces 22a of the gate electrodes 22 and to fill the gate electrode trenches 18 and the trench-like openings 26B. The embedded insulating film 24 has a top face 24a flush with the top face 26a of the mask insulating film 26.

Figure 10A:
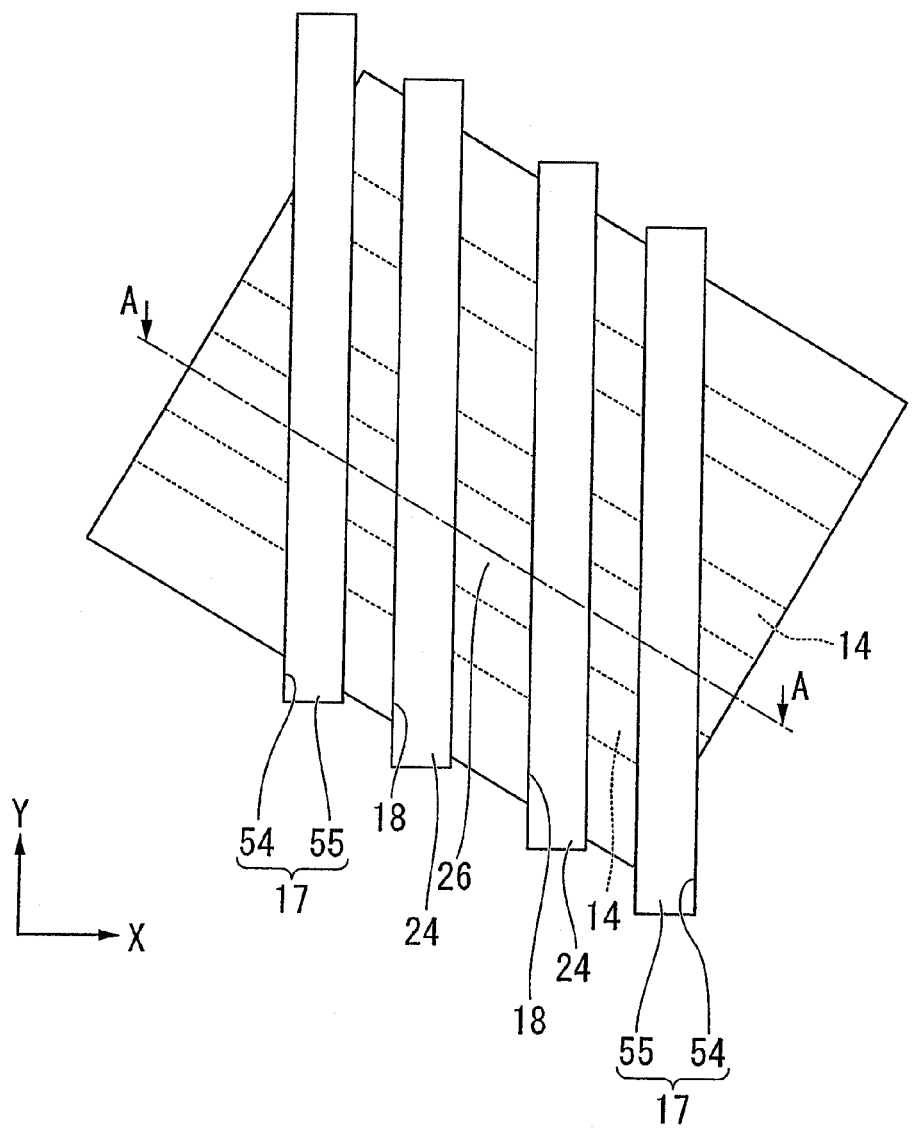
FIG. 10A is a diagram illustrating a manufacturing step (step 8) of the memory cell array provided in the semiconductor device according to the embodiment of the invention and is a plan view of a region where the memory cell array is formed.
Figure 10B:
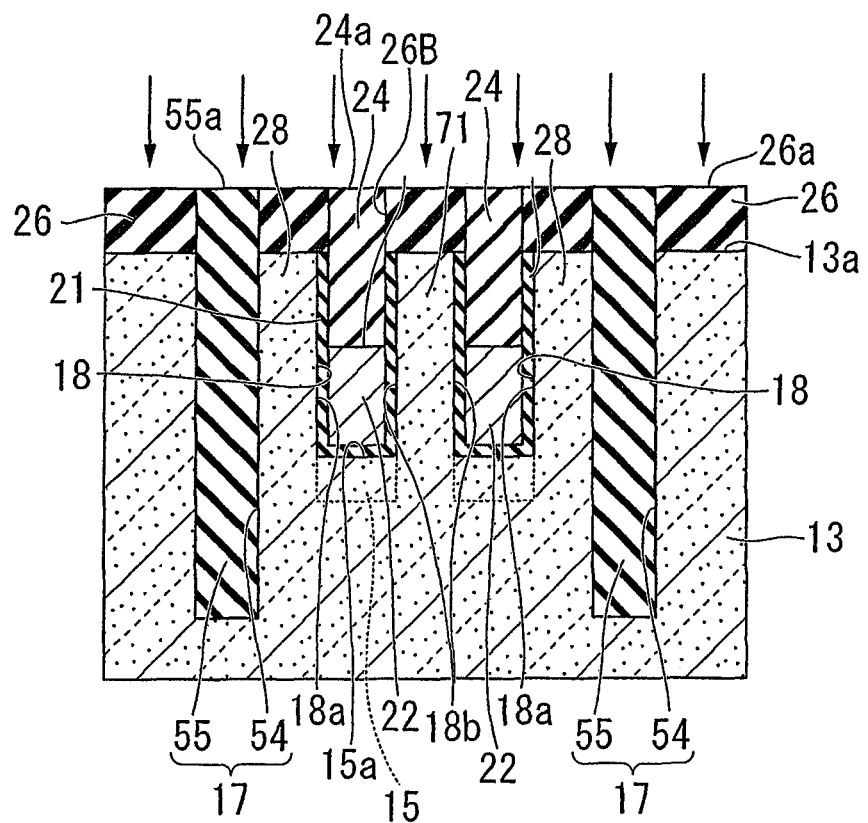
FIG. 10B is a cross-sectional view of the structure shown in FIG. 10A taken along the line A-A thereof.

In the step shown in FIGS. 10A and 10B, phosphorus (P) ion as a n-type impurity is implanted into the entire top face of the structure shown in FIGS. 9B and 9C under the conditions of energy of 100 KeV and a dose amount of 1E14 atoms/cm$^2$, whereby first impurity diffusion regions 28 are formed in the semiconductor substrate 13 between the gate electrode trenches 18 and the first element isolation regions 17, while an impurity diffusion region 71 constituting a part of the second impurity diffusion region 29 is formed in the semiconductor substrate 13 present the two gate electrode trenches 18.

In this manner, the first impurity diffusion regions 28 are formed in the parts of the semiconductor substrate 13 present on the sides of the first side faces 18a of the gate electrode trenches 18 so as to cover the upper parts 21A of the gate insulating films 21 formed on the first side faces 18a.

The first impurity diffusion regions 28 are each formed to include the top face 13a of the part of the semiconductor substrate 13 interposed between the first side face 18a and the second element isolation trench 54 and to have its bottom face 28b at a higher level than the top faces 22a of the gate electrodes 22.

The formation of the first impurity diffusion regions 28 need not necessarily be performed in this step, but may be performed in the step shown in FIG. 4 or FIG. 5, for example.

Figure 11A:
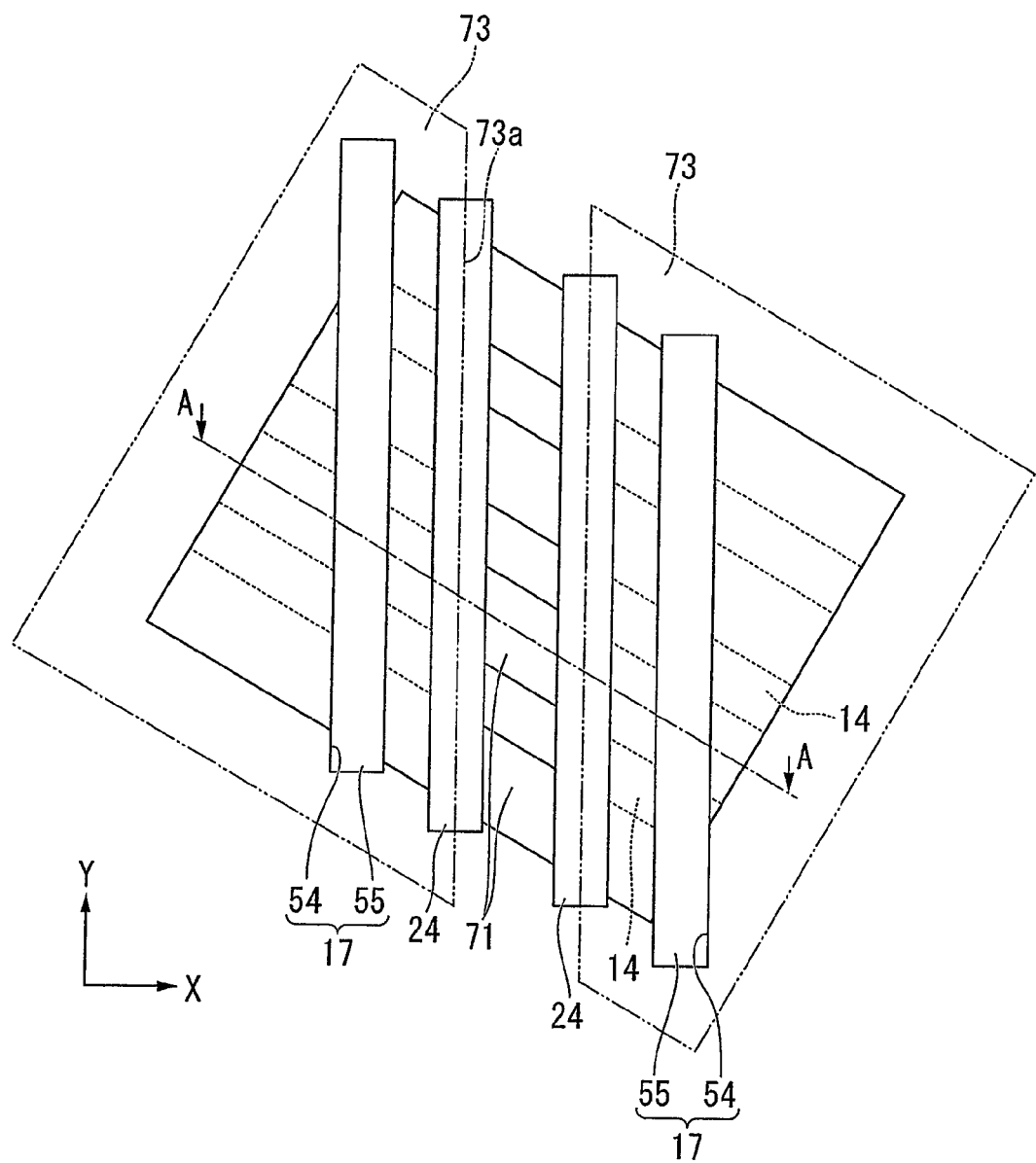
FIG. 11A is a diagram illustrating a manufacturing step (step 9) of the memory cell array provided in the semiconductor device according to the embodiment of the invention and is a plan view of a region where the memory cell array is formed.
Figure 11B:
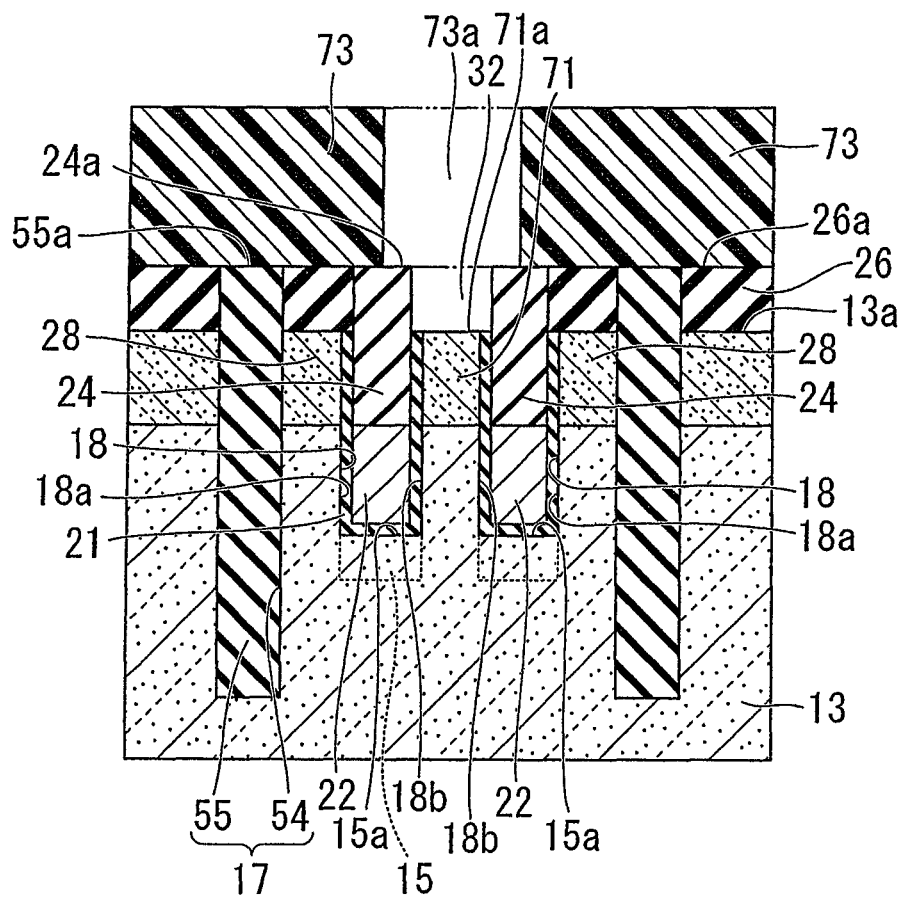
FIG. 11B is a cross-sectional view of the structure shown in FIG. 11A taken along the line A-A thereof.

In the step shown in FIGS. 11A and 11B, a mask film 73 having a trench-like opening 73a exposing the top face 26a of the mask insulating film 26 present between the embedded insulating films 24 is formed on the top faces 24a of the embedded insulating films 24, the top face 26a of the mask insulating film 26, and the top faces 55a of the second element isolation insulating films 55.

Subsequently, the mask insulating film 26 exposed from the opening 73a is removed by anisotropic dry etching, using the mask film 73 as a mask. An opening 32 is formed by the removal of the mask insulating film 26.

Thus, the top face 71a of the impurity diffusion region 71 is exposed and a part of the top face 52 of the first element isolation insulating film 52 flush with the top face 71a of the impurity diffusion region 71 is exposed.

Figure 12A:
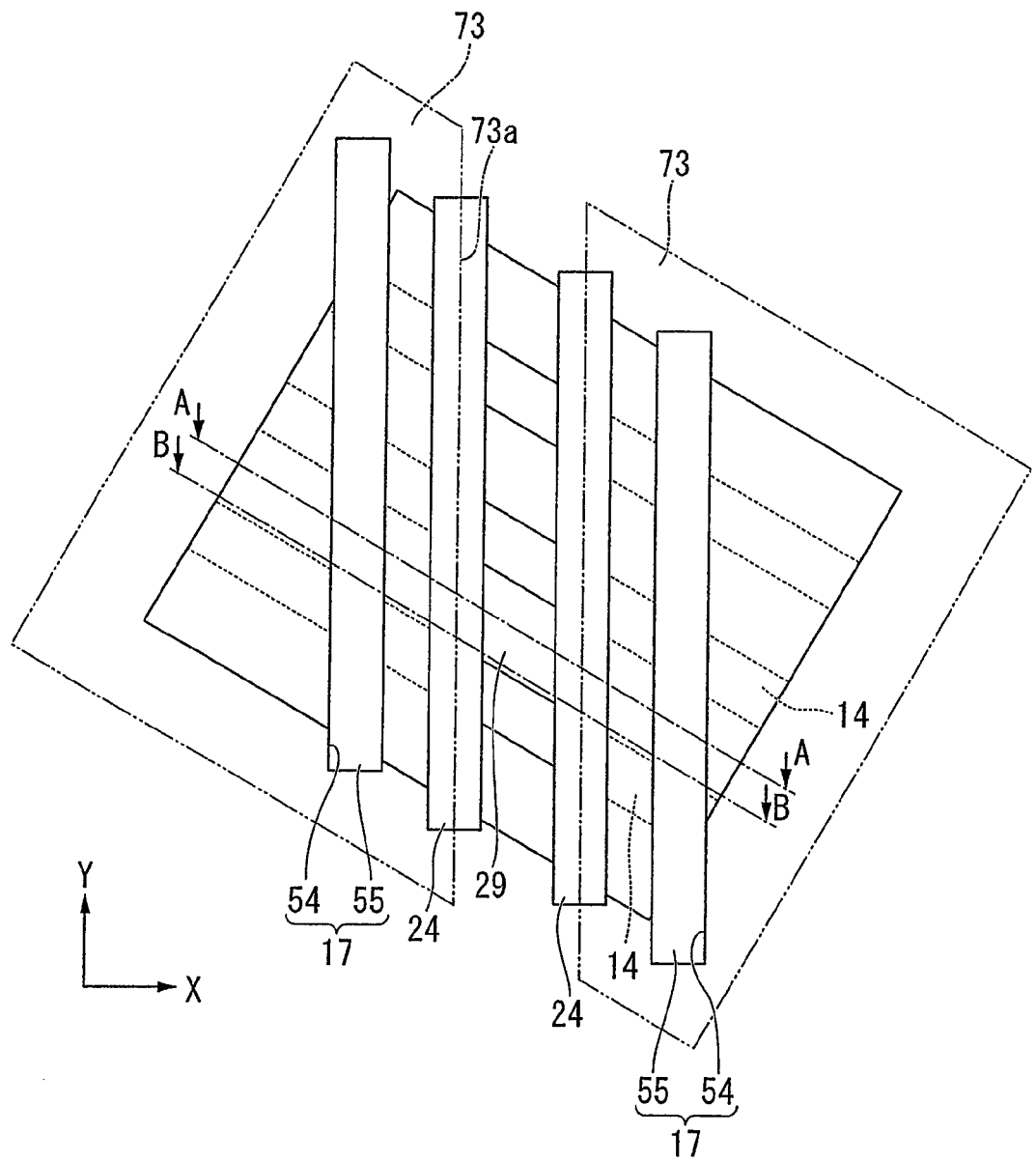
FIG. 12A is a diagram illustrating a manufacturing step (step 10) of the memory cell array provided in the semiconductor device according to the embodiment of the invention and is a plan view of a region where the memory cell array is formed.
Figure 12B:
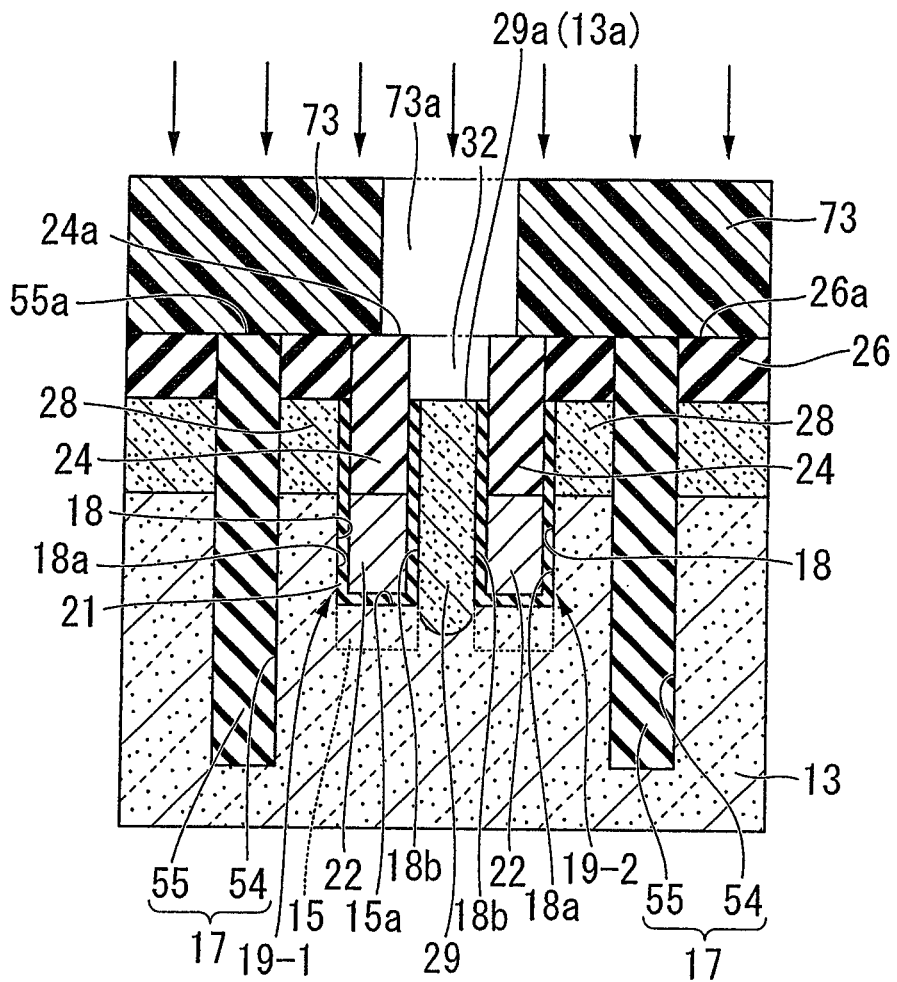
FIG. 12B is a cross-sectional view of the structure shown in FIG. 12A taken along the line A-A thereof.
Figure 12C:
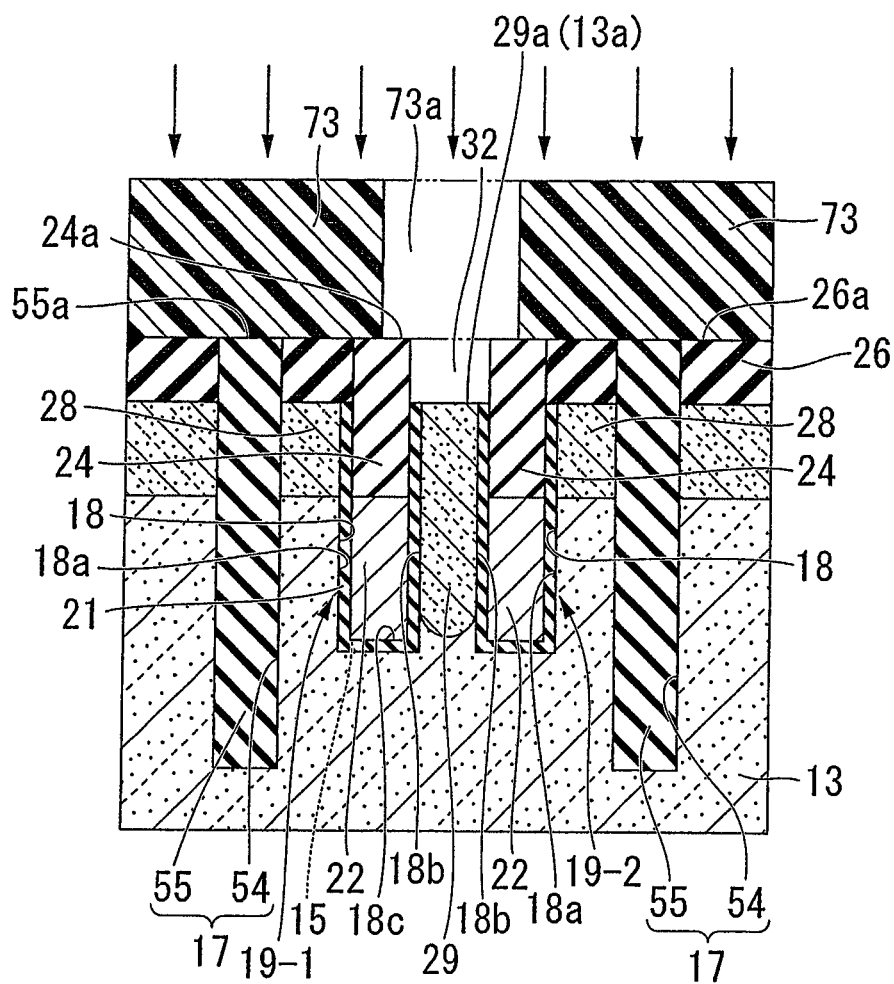
FIG. 12C is a cross-sectional view of the structure shown in FIG. 12A taken along the line B-B thereof.

In the step shown in FIGS. 12A to 12C, phosphorus (P) ion as an n-type impurity is selectively implanted in the impurity diffusion region 71 exposed from the mask film 73 (in other words, in the part of the semiconductor substrate 13 where the impurity diffusion region 71 is formed), whereby a second impurity diffusion region 29 is formed in a part of the semiconductor substrate 13 located between the two gate electrode trenches 18 such that the bottom of the second impurity diffusion region 29 is located at a level between the apexes of the top faces 15a of the fins 15 and the bottoms 18c of the gate electrode trenches 18. The ion implantation is performed in two steps. In the first step, the ion implantation is performed under the conditions of energy of 15 KeV and a dose amount of 5E14 atoms/cm$^2$, and then in the second step, the ion implantation is performed under the conditions of energy of 30 KeV, and a dose amount of 2E13 atoms/cm$^2$.

In this manner, the second impurity diffusion region 29 is formed to cover the entire of the gate insulating films 21 formed on the second side faces 18b of the two gate electrode trenches 18, except the lower ends of the gate insulating films 21, and first and second transistors 19-1 and 19-2 each having the gate insulating film 21, the fin 15, the gate electrode 22, the embedded insulating film 24, the first impurity diffusion region 28, and the second impurity diffusion region 29 are formed. The mask film 73 is then removed.

Figure 13A:
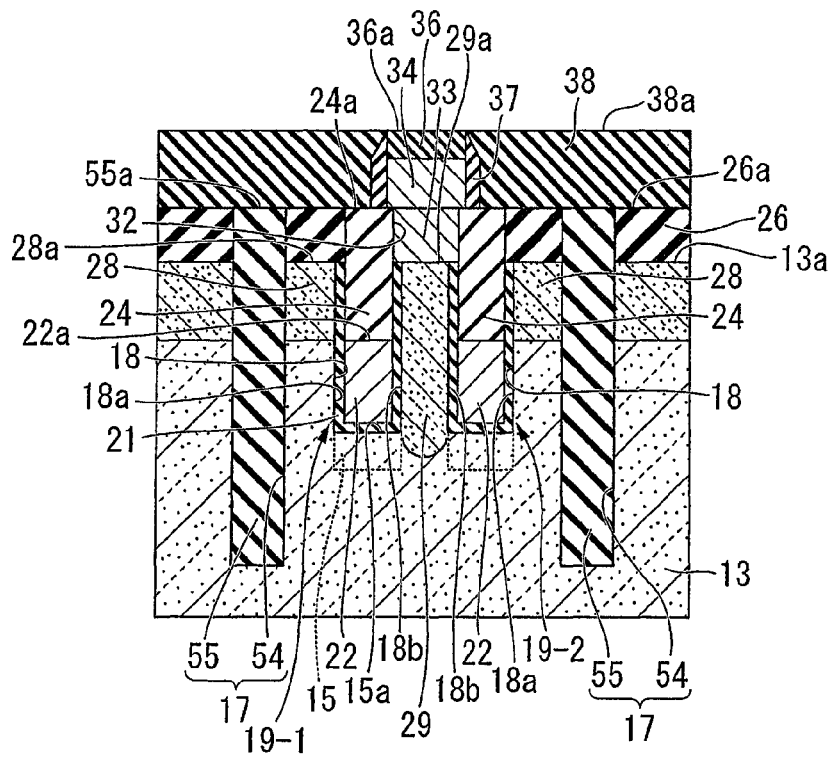
FIG. 13A is a diagram illustrating a manufacturing step (step 12) of the memory cell array provided in the semiconductor device according to the embodiment of the invention and is a cross-sectional view corresponding to the cross-section of FIG. 2A.
Figure 13B:
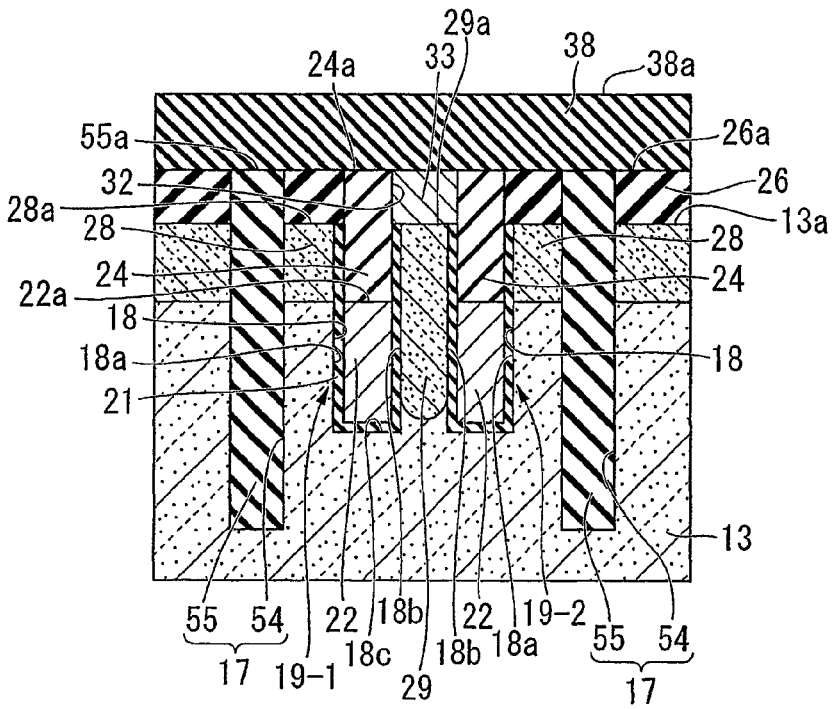
FIG. 13B is a cross-sectional view corresponding to the cross-section of FIG. 2B.

In the step shown in FIGS. 13A and 13B, bit line contact plugs 33 for filling the openings 32, and bit lines 34 arranged on the bit line contact plugs 33 and extending in the X direction (see FIG. 1) are formed collectively.

Specifically, as shown in FIG. 13A, the opening 32 is filled with a phosphorus-doped silicon film to form a bit line contact plug 33. In this step, the bit line contact plug 33 is separated in the second direction. Then, a titanium nitride film, a tungsten film, and a cap insulating film 36 are sequentially formed on the top face 24a of the embedded insulating film 24.

Subsequently, a mask film for forming a bit line pattern is formed on the cap insulating film 36. The cap insulating film 36, the tungsten film, the titanium nitride film, and the phosphorus-doped silicon film are patterned by anisotropic dry etching using the mask film as a mask, so that bit line contact plugs 33 separated in the second direction and bit lines 34 formed on the bit line contact plugs 33 and consisting of a titanium nitride film and a tungsten film are formed collectively.

Subsequently, sidewall films 37 each consisting of a silicon nitride film (SiN film) and a silicon oxide film (SiO$_2$ film) which are not shown are formed to cover the side faces of the bit lines 34 and the cap insulating film 36. Further, an interlayer insulating film 38 having the top face 38a flush with the top face 36a of the cap insulating film 36 is formed on the entire surface.

Subsequently, as shown in FIGS. 2A and 2B, the interlayer insulating film 38, the mask insulating film 26, the embedded insulating film 24, and the gate insulating film 21 are anisotropically dry etched, so that capacity contact holes 41 exposing a part of the top faces 28a of the first impurity diffusion regions 28 are formed.

Subsequently, a titanium nitride film and a tungsten film are sequentially formed by a CVD method so as to fill the capacity contact holes 41. Then, undesired parts of the titanium nitride film and tungsten film formed on the top face 38a of the interlayer insulating film 38 are removed by polishing using a CMP method, so that the capacity contact plugs 42 are formed. Subsequently, formation of the capacity contact pads 44, formation of the silicon nitride film 46, and formation of the capacitors 48 each consisting of a lower electrode 57, a capacity insulating film 58, and an upper electrode 59 are performed, whereby the semiconductor device 10 according to the embodiment is manufactured.

It is apparent that the present invention is not limited to the above embodiments, but may be modified and changed without departing from the scope and spirit of the invention. For example, the above embodiments have been described using an example of a semiconductor device represented by a DRAM. Nevertheless, the present invention is applicable to any other semiconductor devices. The number and size of pads arranged are not limited to the illustrated examples and may be set in any desired manner.

Figure 14:
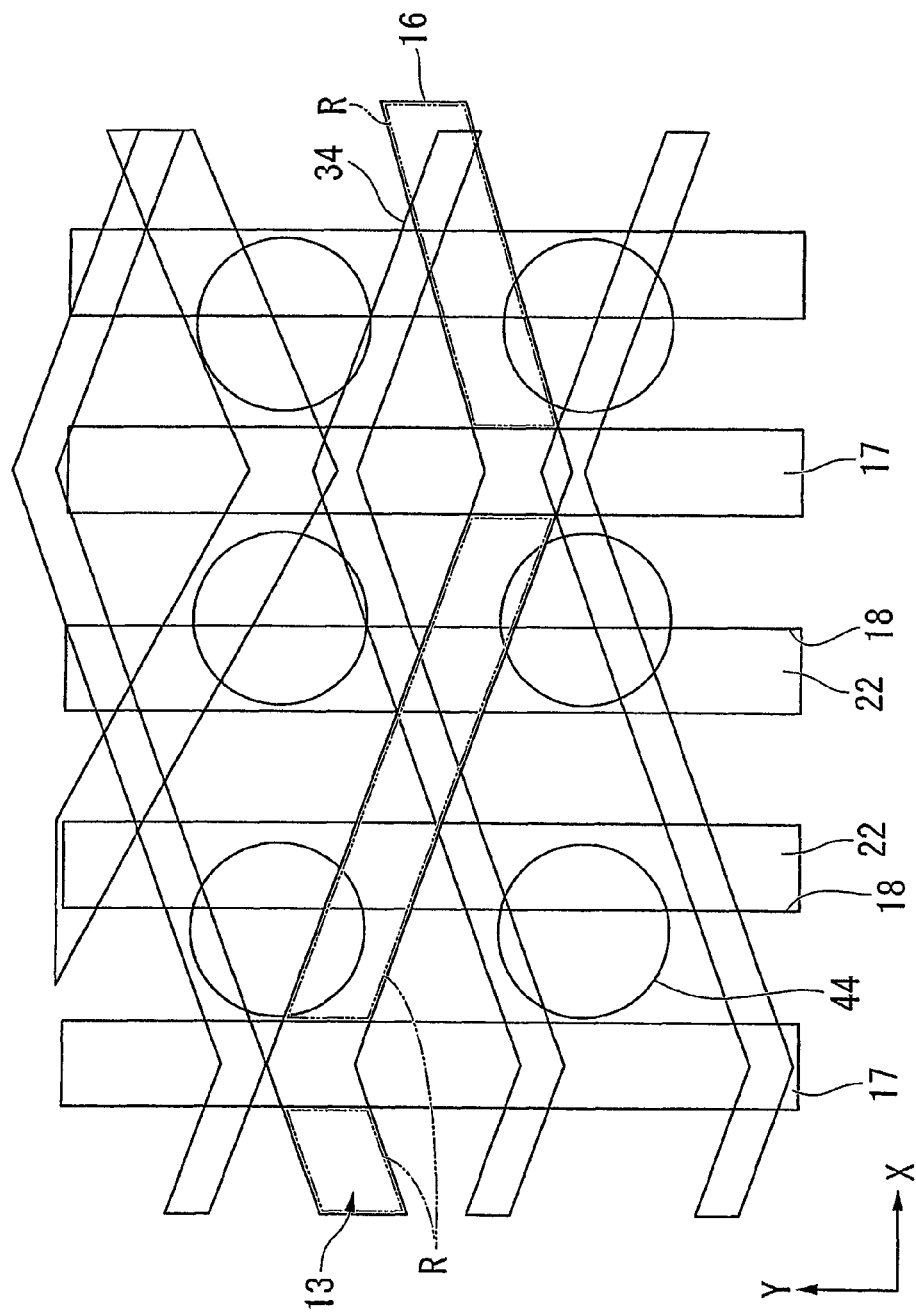
FIG. 14 is a plan view showing another example of a layout of a memory cell array applicable to a semiconductor device according to the embodiment of the invention.

FIG. 14 is a plan view showing another example of a memory cell array layout which is applicable to the semiconductor device according to the embodiment of the invention. In FIG. 14, like components as those of the structure shown in FIG. 1 are indicated by the same reference numerals.

The semiconductor device 10 according to the embodiment as described above is also applicable to the layout as shown in FIG. 14 in which active regions 16 and bit lines 34 are formed in a zigzag pattern.

The invention is applicable to a semiconductor device and a manufacturing method thereof.

What is claimed is:

1. A semiconductor device comprising:
a plurality of first element isolation regions provided in a semiconductor substrate to extend in a first direction and each defining an active region having a plurality of element formation regions;
a gate electrode trench provided in a surface layer of the semiconductor substrate to extend in a second direction intersecting with the first element isolation regions and the active regions, and having first and second side faces facing each other and a bottom;
a fin formed such that a part of the active region protrudes from the bottom of the gate electrode trench by forming the gate electrode trench such that a first trench section thereof formed in the active region has a smaller depth than a second trench section thereof formed in the first element isolation region, and the depth of the part of the first trench facing the second trench section is substantially the same as that of the second trench section;
a gate insulating film covering the surfaces of the gate electrode trench and the fin;
a gate electrode formed to stride over the fin via the gate insulating film by being embedded in a lower part of the gate electrode trench;
a first impurity diffusion region formed in the semiconductor substrate so as to cover the top of the gate insulating film arranged on the first side face; and
a second impurity diffusion region formed in the semiconductor substrate so as to cover the gate insulating film formed on the second side face except a lower end thereof,
wherein the gate insulating film has a relationship represented by $t1<t2$ between its thickness $t1$ on the first and second side faces of the gate electrode trench and its thickness $t2$ at the top of the fin.

2. The semiconductor device according to claim 1, wherein the gate insulating film has a relationship represented by $t2 \geq t4 < t3$ among its thickness $t3$ in a vertical direction to the normal line on the interface between the fin and the gate insulating film at a position shifted from the top part of the fin to the bottom side of the gate electrode trench by a distance corresponding to 90% of the height of the fin, and its film thickness $t4$ between $t2$ and $t3$.

3. The semiconductor device according to claim 1, wherein the depth of the second impurity diffusion region is shallower than the bottom of the gate electrode trench but deeper than the top part of the fin.

4. The semiconductor device according to claim 1, wherein the gate electrode trench is provided in pair such that the second side faces face each other, and the second impurity diffusion region is provided in a part of the semiconductor substrate between the two gate electrode trenches.

5. The semiconductor device according to claim 1, wherein the first impurity diffusion region is formed such that its depth is shallower than the top face of the gate electrode by a distance of 5 to 10 nm.

6. The semiconductor device according to claim 1, wherein:
the fin has a top part and a pair of side faces facing each other;
the top part extends in the first direction and the opposite ends of the top part extend over the first side face and the second side face of the first trench; and
the pair of side faces are arranged in parallel to the first direction.

7. The semiconductor device according to claim 1, further comprising a plurality of second element isolation regions provided in the semiconductor substrate to extend in a second direction intersecting with the first direction, and defining the active region into a plurality of the element formation regions.

8. The semiconductor device according to claim 1, comprising a bit line electrically connected to the second impurity diffusion region and extending in a direction intersecting with the gate electrode.

9. The semiconductor device according to claim 1, comprising:
an interlayer insulating film provided on the embedded insulating film;
a contact plug provided in the embedded insulating film and the interlayer insulating film so as to be in contact with the top face of the first impurity diffusion region;
a capacity contact pad provided on the interlayer insulating film to be contact with the top face of the contact plug; and
a capacitor provided on the capacity contact pad.

10. A semiconductor device comprising:
a semiconductor substrate;

a plurality of first element isolation regions provided in the semiconductor substrate to extend in a first direction and each defining an active region having a plurality of element formation regions;

a plurality of second element isolation regions provided in the semiconductor substrate to extend in a second direction intersecting with the first direction, and defining each active region into a plurality of the element formation regions;

a pair of gate electrode trenches formed in a surface layer of the semiconductor substrate between the adjacent second element isolation regions to extend in the second direction intersecting with the first element isolation regions and active regions, and each having a bottom and first and second side faces facing each other;

fins each formed such that a part of the active region protrudes from the bottom of the gate electrode trench by forming the gate electrode trench such that a first trench section thereof formed in the active region has a smaller depth than a second trench section thereof formed in the first element isolation region, and the depth of the part of the first trench facing the second trench section is substantially the same as that of the second trench section;

a gate insulating film covering the surfaces of the gate electrode trenches and the fins;

a pair of gate electrodes formed by being embedded in the lower parts of the pair of gate electrode trenches so as to stride over the fins via the gate insulating film;

two first impurity diffusion regions provided on the top face of the semiconductor substrate between the second element isolation regions and the gate electrode trenches and connected to the capacitor; and a single second impurity diffusion region provided in the semiconductor substrate between the gate electrode trench pair arranged such that the second side faces face each other, and connected to a bit line, wherein:

the element formation regions share the second impurity diffusion region and each have a first transistor composed at least of one of the gate electrodes, one of the fins, and one of the first impurity diffusion regions, and a second transistor composed at least of the other gate electrode, the other fin, and the other first impurity diffusion region; and the gate insulating film has a relationship represented by $t1<t2$ between its thickness $t1$ on the first and second side faces of the gate electrode trench and its thickness $t2$ at the top of the fins.

11. The semiconductor device according to claim 10, wherein the gate insulating film has a relationship represented by $t2 \geq t4 < t3$ among its thickness $t3$ in a vertical direction to the normal line on the interface between the fins and the gate insulating film at a position shifted from the top part of the fins to the bottom side of the gate electrode trench by a distance corresponding to 90% of the height of the fins, and its film thickness $t4$ between $t2$ and $t3$.

12. The semiconductor device according to claim 10, wherein the depth of the second impurity diffusion region is shallower than the bottoms of the gate electrode trenches and deeper than the top parts of the fins.

13. The semiconductor device according to claim 10, wherein channel regions of the first and second transistors are each constituted by:

a part of the semiconductor substrate located at a lower level than the bottom face of the first impurity diffusion region and in contact with the first side face thereof;

a part of the semiconductor substrate in contact with the bottom of the gate electrode trench;

a part of the semiconductor substrate in contact with the second side face and not in contact with the second impurity diffusion region; and the fins.

* * * * *